United States Patent
Watanabe et al.

(10) Patent No.: US 9,910,458 B2
(45) Date of Patent: Mar. 6, 2018

(54) FLEXIBLE DISPLAY DEVICE WITH STOPPABLE HINGE

(71) Applicant: Sharp Kabushiki Kaisha, Sakai, Osaka (JP)

(72) Inventors: Noriko Watanabe, Sakai (JP); Akiko Itoh, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/304,885

(22) PCT Filed: Apr. 20, 2015

(86) PCT No.: PCT/JP2015/061953
§ 371 (c)(1),
(2) Date: Oct. 18, 2016

(87) PCT Pub. No.: WO2015/163272
PCT Pub. Date: Oct. 29, 2015

(65) Prior Publication Data
US 2017/0192460 A1 Jul. 6, 2017

(30) Foreign Application Priority Data
Apr. 24, 2014 (JP) ................. 2014-090073

(51) Int. Cl.
*G06F 1/16* (2006.01)
*H04M 1/02* (2006.01)
(Continued)

(52) U.S. Cl.
CPC ............. *G06F 1/1652* (2013.01); *E05D 3/00* (2013.01); *G02F 1/133305* (2013.01); *G06F 1/16* (2013.01); *H04M 1/0268* (2013.01)

(58) Field of Classification Search
CPC combination set(s) only.
See application file for complete search history.

(56) References Cited

U.S. PATENT DOCUMENTS 8,787,016 B2* 7/2014 Rothkopf ............ H04M 1/0216
361/679.02
8,971,031 B2* 3/2015 Mok ..................... G06F 1/1652
349/58
(Continued)

FOREIGN PATENT DOCUMENTS

JP 2002-098941 A 4/2002
JP 2002-106542 A 4/2002
(Continued)

OTHER PUBLICATIONS

Official Communication issued in International Patent Application No. PCT/JP2015/061953, dated Jul. 21, 2015.

*Primary Examiner* — Lisa Lea Edmonds
(74) *Attorney, Agent, or Firm* — Keating and Bennett, LLP

(57) ABSTRACT

A display device 10 includes a flexible display panel having a display surface 11a and flexibility, display support portions 12 supporting the flexible display panel from a side opposite to the display surface 11a side, a hinge portion 13 supporting the two adjacent display support portions 12 to be rotatable, and an angle restricting portion 18 mounted on each of hinge parts 15, 16 and including at least a stopper projection 19 and a stopper hole 20 that are stopped by each other when an angle formed by the two adjacent display supporting portions 12 reaches a predetermined value, the two adjacent display supporting portions 12 being rotated according to bending of the flexible display panel 11 from the flat state and the angle being formed by the two adjacent display supporting portions 12 that are rotated, and the angle restricting portion 18 restricting the angle.

11 Claims, 25 Drawing Sheets

(51) Int. Cl.
  *G02F 1/1333* (2006.01)
  *E05D 3/00* (2006.01)

(56) References Cited

U.S. PATENT DOCUMENTS

| | | | | |
|---|---|---|---|---|
| 9,013,864 B2* | 4/2015 | Griffin | ................ | H04M 1/0216 16/382 |
| 9,086,850 B2* | 7/2015 | Verschoor | ............. | G06F 1/1652 |
| 9,173,287 B1* | 10/2015 | Kim | ....................... | H05K 1/028 |
| 9,173,288 B1* | 10/2015 | Kim | ....................... | G06F 1/1633 |
| 9,179,559 B1* | 11/2015 | Kim | ....................... | G06F 1/1616 |
| 9,235,239 B2* | 1/2016 | van Dijk | ................ | G06F 1/1652 |
| 9,250,733 B2* | 2/2016 | Lee | ........................ | H04M 1/02 |
| 9,348,450 B1* | 5/2016 | Kim | ....................... | G06F 1/1681 |
| 9,470,404 B2* | 10/2016 | Lee | ......................... | F21V 21/30 |
| 9,477,269 B2* | 10/2016 | Morrison | .............. | G06F 1/1681 |
| 9,535,452 B2* | 1/2017 | Ahn | ....................... | H05K 5/0017 |
| 9,557,771 B2* | 1/2017 | Park | ...................... | G06F 1/1641 |
| 9,572,272 B2* | 2/2017 | Lee | ....................... | H04M 1/0216 |
| 9,600,035 B2* | 3/2017 | Park | ...................... | G06F 1/1681 |
| 9,603,271 B2* | 3/2017 | Lee | ...................... | H05K 5/0017 |
| 9,696,763 B2* | 7/2017 | Mok | ....................... | G06F 1/1652 |
| 2012/0044620 A1* | 2/2012 | Song | ...................... | G06F 1/1616 361/679.01 |
| 2012/0264489 A1* | 10/2012 | Choi | ................... | H04M 1/0216 455/566 |
| 2014/0111954 A1* | 4/2014 | Lee | ....................... | G06F 1/1641 361/749 |
| 2014/0196254 A1* | 7/2014 | Song | ....................... | E05D 3/14 16/302 |
| 2014/0328041 A1* | 11/2014 | Rothkopf | ............ | H04M 1/0216 361/807 |
| 2014/0355195 A1* | 12/2014 | Kee | ....................... | G06F 1/1616 361/679.27 |
| 2015/0361696 A1* | 12/2015 | Tazbaz | .................. | H04M 1/022 361/679.27 |
| 2015/0378397 A1* | 12/2015 | Park | ..................... | G06F 1/1652 361/679.27 |
| 2016/0187935 A1* | 6/2016 | Tazbaz | .................. | G06F 1/1681 361/679.03 |

FOREIGN PATENT DOCUMENTS

JP   2006-287982 A   10/2006
JP   2013-050547 A   3/2013

* cited by examiner

FLEXIBLE DISPLAY DEVICE WITH STOPPABLE HINGE

TECHNICAL FIELD

The present invention relates to a display device.

BACKGROUND ART

Display devices using flexible and foldable display panels have been developed and one disclosed in Patent Document 1 has been known. The display device described in Patent Document 1 includes a pair of cases where a flexible display panel is mounted, and a hinge portion that connects the cases so as to be rotatable. The hinge portion includes a projected shaft portion. The projected shaft portion projects to an inner side of the display device where the flexible display panel is mounted. When the flexible display panel is folded, the side edge portion of the flexible display panel is wound around the outer peripheral surface of the projected shaft portion and the bending portion of the flexible portion has a diameter so that the display circuit is not damaged.

RELATED ART DOCUMENT

Patent Document

Patent Document 1: Japanese Unexamined Patent Application Publication No. 2013-50547

Problem to be Solved by the Invention

However, in the display device disclosed in Patent Document 1, the projected shaft portion projects toward the inner side of the display device where the flexible display panel is mounted. Therefore, the projected shaft portion is located closer to a user in user's view when the flexible display panel is in a flat state. The projected shaft portion obstructs the user's view when the user sees an image displayed on the flexible display panel and design properties of the display device may be deteriorated.

DISCLOSURE OF THE PRESENT INVENTION

The technology disclosed herein was made in view of the above circumstances. An object is to prevent a flexible display panel from being damaged without deteriorating visibility and design properties.

Means for Solving the Problem

A display device according to the present technology includes a flexible display panel having a display surface displaying images and having flexibility, display support portions that are arranged along the display surface of the flexible display panel that is in a flat state and support the flexible display panel from a side opposite to the display surface, a hinge portion including at least two hinge parts that are mounted on two of the display support portions, respectively, the two display support portions being adjacent to each other when the flexible display panel is in the flat state, and the hinge portion supporting the two adjacent display support portions to be rotatable, and an angle restricting portion mounted on each of the two hinge parts, the angle restricting portion including at least two stopper portions that are stopped by each other when an angle formed by the two adjacent display supporting portions reaches a predetermined value, the two adjacent display supporting portions being rotated according to bending of the flexible display panel from the flat state and the angle being formed by the two adjacent display supporting portions that are rotated, and the angle restricting portion restricting the angle.

According to such a configuration, the flexible display panel having flexibility is supported by the display support portions, which are arranged along the display surface in the flat state, from the side opposite to the display surface side. The respective hinge parts of the hinge portion are mounted on the respective two display support portions that are adjacent to each other in the flat state of the flexible display panel. Accordingly, the two display support portions are rotatably supported by the hinge portion. If the flexible display panel that is in the flat state is folded, the two adjacent display support portions are moved and rotated around the hinge portion. During the rotation, if the angle formed by the two adjacent display support portions is greater than a predetermined value, the flexible display panel may be damaged. In the present embodiment, if the two adjacent display support portions are rotated according to the folding of the flexible display panel, the stopper projection and the stopper hole of the angle restricting portion are stopped by each other so that the angle formed by the two adjacent display support portions does not exceed the predetermined value. The stopper projection is mounted on the hinge part and the stopper hole is formed in the hinge part. Thus, the flexible display panel is less likely to be damaged since the angle formed by the two adjacent display support portions according to the rotation thereof is directly restricted by the angle restricting portion.

In the related art, the hinge portion includes the projection shaft that the flexible display panel is directly wound around. Therefore, the projection shaft may obstruct a user's view when the user sees an image on the display surface of the flexible display panel and the design properties of the display device may be deteriorated. In the present embodiment, the hinge parts are mounted on the two adjacent display support portions, respectively, and the stopper projection on the hinge part and the stopper hole in the hinge part are stopped by each other so that the angle formed by the two adjacent display support portions according to the rotation thereof is restricted. Therefore, the image displayed on the display surface of the flexible display panel is less likely to be obstructed because of the angle restriction portion and the design properties of the display device are improved.

The display device of the present technology may include following configurations.

(1) The display device may further include a slide portion mounted on the two adjacent display support portions and the hinge portion, the slide portion with which the two adjacent display support portions slide with respect to the hinge portion according to rotation of the two adjacent display support portions. According to such a configuration, when the two adjacent display support portions are moved and rotated according to the folding of the flexible display panel, the two adjacent display support portions slide with respect to the hinge portion via the slide portion. The two adjacent display support portions supporting the flexible display panel slide to be away from each other when moved and rotated. Accordingly, the two adjacent display support portions are not in contact with each other according to the rotation of the display support portions.

(2) The two adjacent display support portions may have opposed surfaces, respectively, and the opposed surfaces may be opposite each other with a clearance therebetween when the flexible display panel is in the flat state. According to such a configuration, in the flat state of the flexible display panel, the clearance between the opposed surfaces of the two adjacent support portions is maintained to be a certain distance or more even when the two adjacent display support portions are moved and rotated according to the folding of the flexible display panel. The two adjacent display support portions slide with respect to the hinge via the sliding portion such that the clearance is maintained to be the certain distance or more. The clearance can receive the deflection caused in the bending portion of the folded flexible display panel. Thus, stress that may act on the bending portion of the flexible display panel 11 can be reduced via the clearance.

(3) The two adjacent display support portions may have support surfaces supporting the flexible display panel, and the support surfaces may be fixed to the flexible display panel except for an end portion of each of the support surfaces near a bending portion of the flexible display panel that is folded. According to such a configuration, the two adjacent display support portions are fixed to the flexible display panel with the support surfaces 1 opposed to the flexible display panel except for the end portions of the support surfaces near the bending portions of the flexible display panel in the folded state. According to such a configuration, the support surfaces of the two adjacent display support portions are fixed to the flexible display panel so that the folding operation of the flexible display panel follows the rotation operation of the adjacent two display support member. When the flexible display panel is folded from the flat state, deflection may be caused in the bending portion. In such a case, the two adjacent display support portions allow deformation and deflection of the flexible display panel caused in the bending portion in folding of the flexible display panel, since the portions of the support surfaces except for the end portions of the support surfaces near the bending portion of the folded flexible display panel are fixed to the flexible display panel.

(4) The display support portions may include at least three display support portions that are arranged in a row when the flexible display panel is in the flat state, the display support portions may include main display support portions and a sub-display support portion, the main display support portions may have a relatively large support area supporting the flexible display panel, and the sub-display support portion may be arranged between the main display support portions when the flexible display panel is in the flat state, and the sub-display support portion may have a relatively small support area supporting the flexible display panel. According to such a configuration, the flexible display panel is supported by the main display support portions and the sub-display support portion that is between the main display support portions in the flat state of the flexible display panel. Therefore, the flexible display panel is bent along at least two bending portions. The flexible display panel is bent in each bending portion at a smaller bending angle so that stress acting on the flexible display panel due to the folding is reduced.

(5) The sub-display support portion may include sub-display portions and the sub-display portions may be arranged adjacent to each other when the flexible display panel is in the flat state. According to such a configuration, the sub-display support portions each of which has a relatively small support area supporting the flexible display panel in the flat state are arranged adjacent to each other so that the bending portions in the folded state of the flexible display panel have greater curvature. Thus, stress that may act on the flexible display panel according to the bending is reduced.

(6) The sub-display support portion may include sub-display support portions, and the display device may further include a spacer arranged between the sub-display support portions when the flexible display panel is in the flat state. According to such a configuration, the spacer is between the multiple sub-display support portions in the flat state of the flexible display panel, and thus, the curvature of the bending portions of the folded flexible display panel can be greater.

(7) The spacer may have an opposed surface and each of the sub-display support portions has an opposed surface, and the opposed surfaces may be opposite each other, and at least one of the opposed surface may be a sloped surface inclined such that a distance between the opposed surfaces gradually increases as is farther away from the flexible display panel in a direction that the flexible display panel and the display support portions are overlapped. According to such a configuration, at least one of the opposed surfaces facing each other between the spacer and the sub-display support portion is the sloped surface, and the distance between the opposed surfaces increases as is farther away from the flexible display panel in the overlapping direction. Therefore, the spacer and the sub-display support portions are easily mounted compared to a configuration that the distance between the opposed surfaces is constant.

(8) The display device may further include connecting hinge parts in pair mounted on the sub-display support portions and the spacer and supporting the sub-display support portions and the spacer rotatably. According to such a configuration, the sub-display support portion and the spacer where the connecting hinge parts are mounted are moved and rotated, when the flexible display panel is folded. Thus, the sub-display support portion and the spacer are arranged following a shape of bending portions of the flexible display panel.

(9) The display device may further include a spring part that is elastically shrunk and expanded and one end of which is connected to the sub-display support portion and another end of which is connected to the spacer. According to such a configuration, the spring part shrinks when the flexible display panel is folded and the sub-display support portion and the spacer that are connected via the spring part are arranged following a shape of the bending portion of the flexible display panel.

(10) The main display support portion may include main display support portions in pair having the sub-display support portion therebetween when the flexible display panel is in the flat state, and each of the main display support portions may have a dimension in a direction that the flexible display panel and the main display support portions are overlapped, and the dimension may increase as is farther away from the sub-display support portion. According to such a configuration, when the flexible display panel is folded such that the main display supporting portions are opposite each other, the opposed surfaces of the main display supporting portions are parallel to each other. The opposed surfaces are opposite to the flexible display panel. Accordingly, portability and design of the display device in the folded state of the flexible display panel is improved.

(11) The hinge parts of the hinge portion may be mounted on the two adjacent display support portions, respectively, on a surface of each of the two adjacent display support portions, the surface may be opposite to a support surface supporting the flexible display panel. If a hinge part is mounted on the support surface of the display support portion, the hinge part may be directly in contact with the flexible display panel. In the present embodiment, the hinge parts are mounted on the surfaces opposite to the support surfaces of the displays support portions and such a problem may be obviated.

Advantageous Effect of the Invention

According to the technology disclosed in this specification, a flexible display panel is less likely to be damaged without deteriorating visibility and design properties.

MODE FOR CARRYING OUT THE INVENTION

First Embodiment

A first embodiment of the present technology will be described with reference to FIGS. 1 to 7. A display device 10 including a flexible display panel 11 will be described in the present embodiment. X-axis, Y-axis and Z-axis may be indicated in some of the drawings. The axes in each drawing correspond to the respective axes in other drawings. An up-down direction is referred with reference to FIGS. 1 and 3 and an upper side is a front-surface side and a lower side is a rear-surface side in FIGS. 1 and 3.

Figure 1:
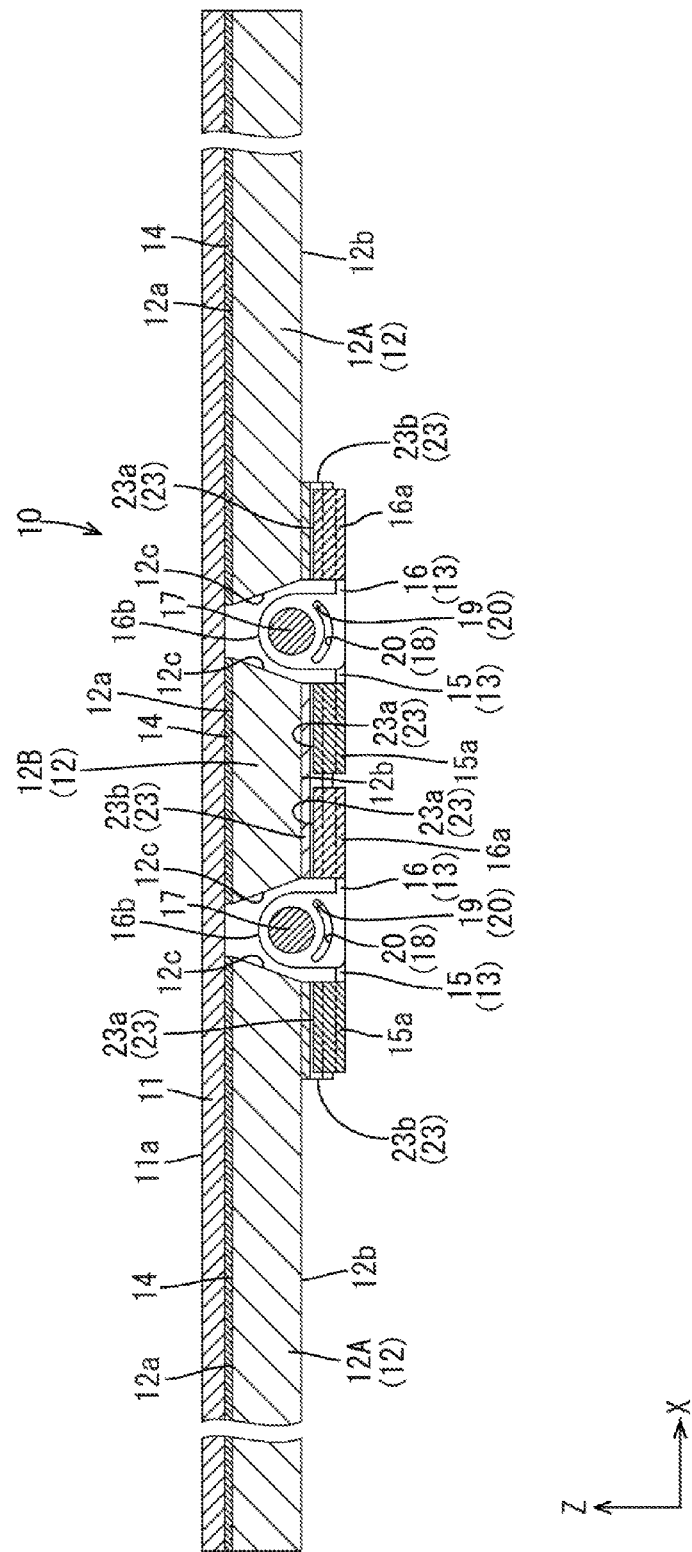
FIG. 1 is a side cross-sectional view of a flexible display panel included in a display device according to a first embodiment of the present technology when the flexible display panel is in a flat state.
Figure 2:
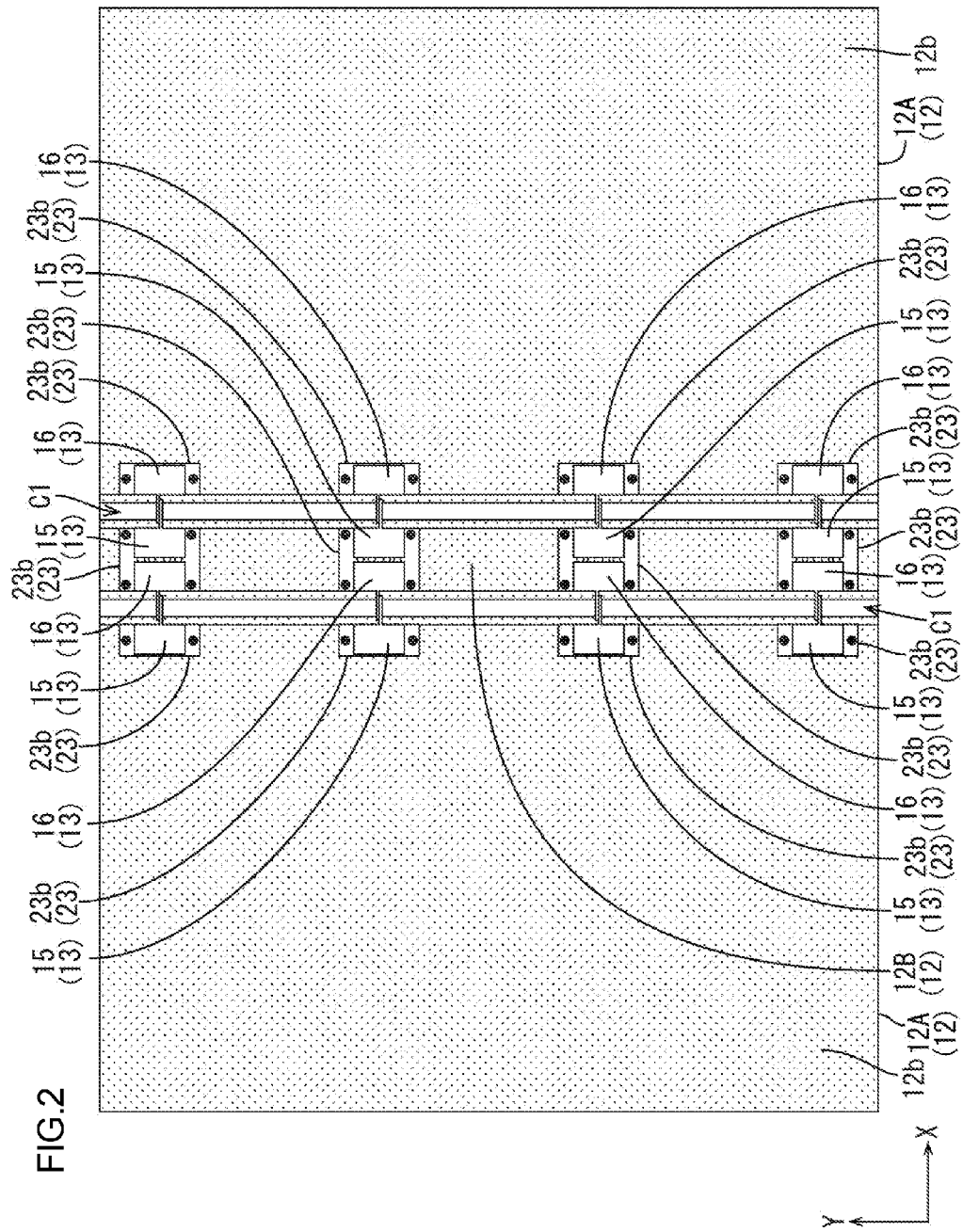
FIG. 2 is a bottom view of the flexible display panel in the flat state.
Figure 4:
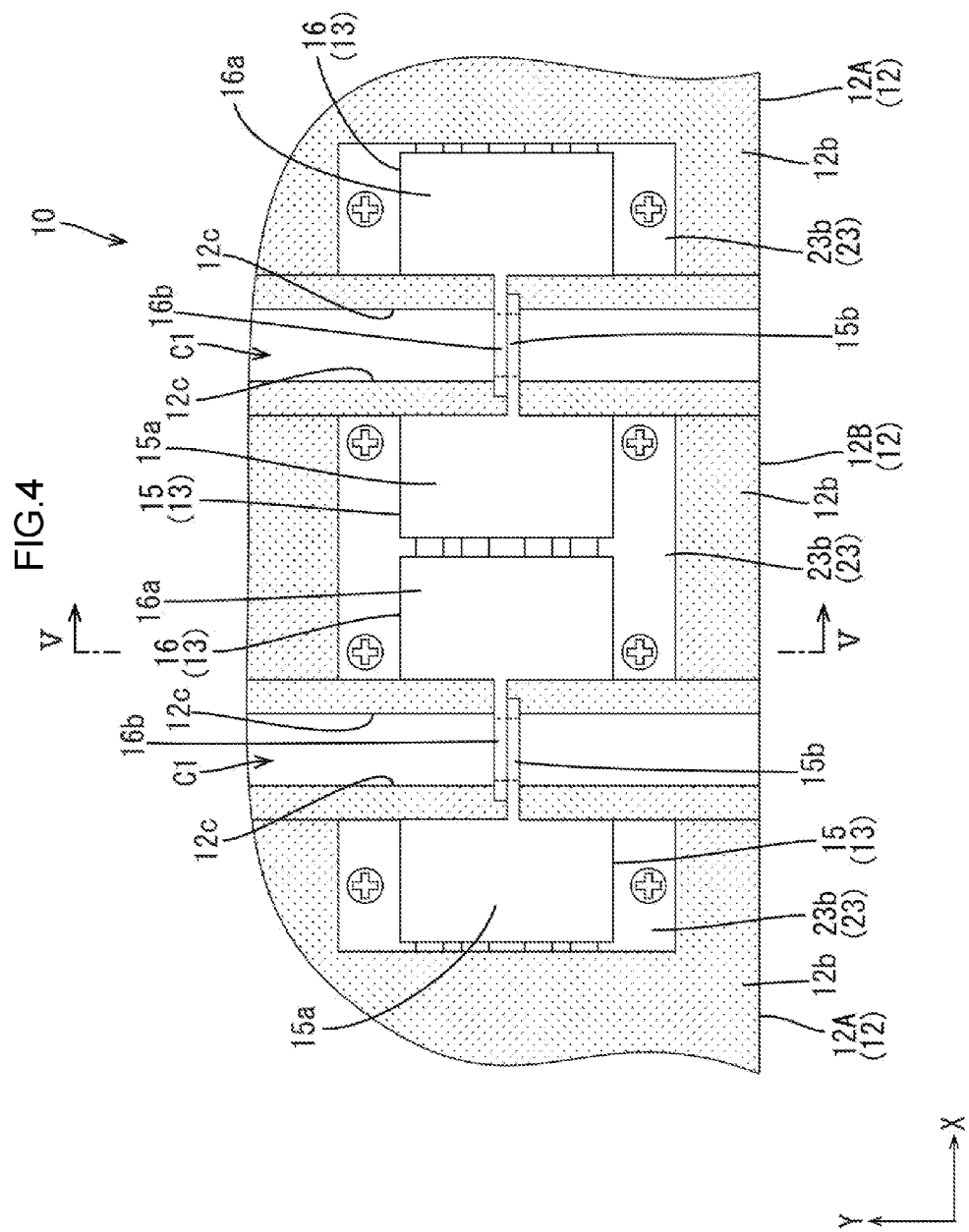
FIG. 4 is a bottom view of the hinge portion and the angle restricting portion.

As illustrated in FIGS. 1 and 2, the display device 10 includes a flexible display panel 11, display support portions 12, and hinge portions 13. The flexible display panel 11 has flexibility and includes a display surface 11a where images appear. The display support portions 12 support the flexible display panel 11 from a side opposite to the display surface 11a side. The hinge portions 13 rotatably support the display support portions 12 that are adjacent to each other when the flexible display panel 11 is in a flat state. The display device 10 has a rectangular planar shape when the flexible display panel 11 is in the flat state. A short-side direction is along the X-axis direction in each drawing and a long-side direction is along the Y-axis direction in each drawing. The display device 10 is bendable or foldable at a middle portion with respect to the long-side direction as a bending portion and the display device 10 is bent into a substantially half of the size of the display device 10 (see FIG. 6). The display device 10 has a short-side dimension of approximately 210 mm and has a long-side dimension of approximately 297 mm, that is, so-called A4 size. In FIGS. 2 and 4, the display support portions 12 are illustrated with shading.

As illustrated in FIG. 1, the flexible display panel includes a flexible film (flexible substrate) having flexibility, and multiple pixels arranged in a matrix on the flexible film. The pixel is a display unit. Namely, the flexible display panel 11 is a flexible organic EL panel. In each of the drawings, a configuration of the flexible display panel 11 is illustrated simply and a detailed configuration of the flexible display panel 11 that is not illustrated in the drawings will be described hereinafter. The flexible film is made of a thin film of a synthetic resin material such as polyimide, polyamide, polyamide-imide, and PEN (polyethylenenaphthalate). The thin film has film thickness of 10 µm to 100 µm, for example. The organic LED configuring a pixel is a self-light-emitting component that includes a light emission layer of an organic light emission material and electrodes that are layered on the flexible film. The organic LEDs include ones emitting red light, ones emitting blue light, and ones emitting green light. The organic LEDs of three colors R, G, B are arranged alternately along a row direction repeatedly and thus, and an organic LED group is formed. Multiple organic LED groups are arranged in a column direction. A TFT configuring a pixel is connected to each organic LED independently and the TFTs are arranged in a matrix similarly to the organic LEDs. The TFT may include an oxide semiconductor as a semiconductor material. An example of the oxide semiconductor may be In—Ga—Zn—O type semiconductor (Indium Gallium Zinc Oxide) mainly including indium (In), gallium (Ga), zinc (Zn), and oxide (O). Each TFT controls a current flow supplied to each organic LED so that an amount of light emission from each organic LED is controlled. Accordingly, full color images can be displayed on the display surface 11a of the flexible display panel 11 with multi-gradation. The organic LEDs, the TFTs, and traces connected to the organic LEDs and the TFTs are mounted on the flexible film.

As illustrated in FIGS. 1 and 2, the display support portions 12 are made of synthetic resin material or metal material (such as aluminum and titanium) and have a thickness greater than that of the flexible display panel 11 and have rigidity greater than that of the flexible display panel 11. Portions of the flexible display panel 11 that are supported by the display support portions 12 have high flatness. The display support portions 12 have support surfaces 12a (inner surfaces) that are opposite the flexible display panel 11 and support the flexible display panel 11 with the support surfaces 12a. The display support portions 12 are fixed (bonded) to the flexible display panel 11 via a fixing layer 14 over a substantially entire area of the support surfaces 12a and fixed to a surface of the flexible display panel 11 opposite to the display surface 11a. The display support portions 12 have a thickness of approximately 6 mm. The fixing layer 14 is made of glue or adhesive and has a thickness of preferably 300 µm or less. The flexible display panel 11 and the display support portions 12 are overlapped with each other in the Z-axis direction in each drawing when the flexible display panel 11 is in the flat state.

As illustrated in FIGS. 1 and 2, three display support portions 12 are arranged in a row along the long-side direction (the X-axis direction) when the flexible display panel 11 is in the flat state. The flexible display panel 11 supported by the three display support portions 12 is bendable at borders of the display support portions 12. In the present embodiment, the flexible display panel 11 has two bending portions (see FIG. 6). The three display support portions 12 include two main display support portions 12A and a sub-display support portion 12B. The main display support portions 12A have a relatively large support area supporting the flexible display panel 11 and the sub-display support portion 12B has a relatively small support area supporting the flexible display panel 11. Hereinafter, each display support portion 12 is specified as the main display support portion 12A and as the sub-display support portion 12B and the display support portions generally represented by the numeral without alphabets.

As illustrated in FIGS. 1 and 2, the two main display support portions 12A are arranged to support most part on one end and most part on another end of the flexible display panel 11 in the flat state, respectively. The main display support portions 12A do not support a middle portion of the flexible display panel 11 with respect to the long-side direction. Each of the main display support portions 12A has a rectangular planar shape and has a short-side direction corresponding with the long-side direction (the X-axis direction) of the flexible display panel 11 and has a long-side direction corresponding with the short-side direction (the Y-axis direction) of the flexible display panel 11. Each main display support portion 12A has a short-side dimension of approximately 145 mm and has a long-side dimension of approximately 210 mm.

As illustrated in FIGS. 1 and 2, the sub-display support portion 12B is arranged to support the middle portion of the flexible display panel 11 with respect to the long-side direction thereof in the flat state. Namely, the sub-display support portion 12B is arranged between the two main display support portions 12A with respect to an arrangement direction in which the display support portions 12 are arranged (the X-axis direction). The sub-display support portion 12B is adjacent to both of the main display support portions 12A. The sub-display support portion 12B has a rectangular planar shape (vertically long belt-like shape), and has a short-side direction corresponding to the long-side direction (X-axis direction) of the flexible display panel 11 and has a long-side direction corresponding to the short-side direction (Y-axis direction). The sub-display support portion 12B has a short-side dimension of approximately 7 mm and has a long-side dimension of approximately 210 mm. Namely, the sub-display support portion 12B has the long-side dimension equal to the long-side dimension of each main display support portion 12A and has the short-side dimension that is approximately 1/20 of the short-side dimension of each main display support portion 12A.

Figure 3:
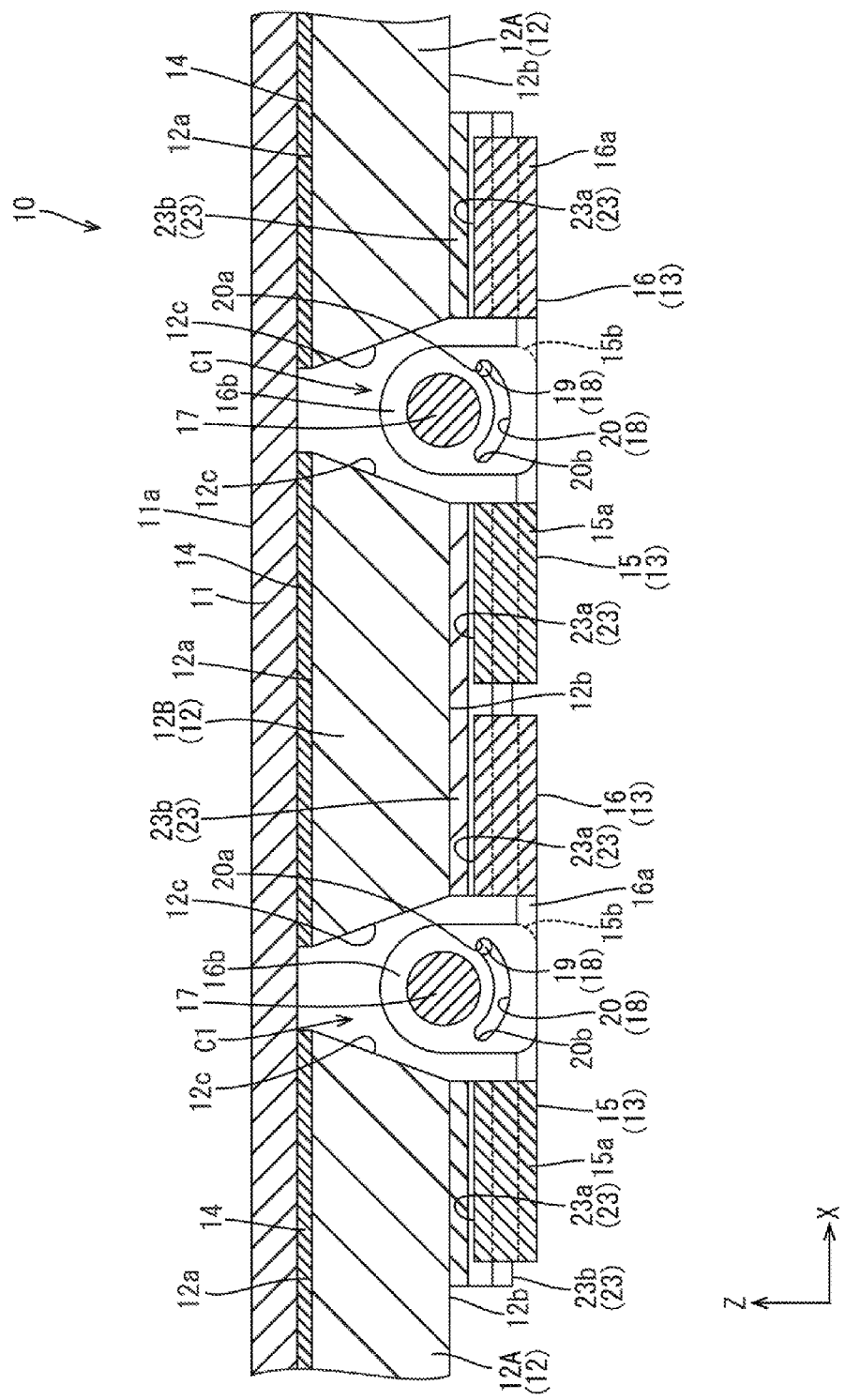
FIG. 3 is a side cross-sectional view of a hinge portion and an angle restricting portion.

As illustrated in FIGS. 1 and 2, the hinge portion 13 is mounted to bridge the display support portions 12 that are adjacent to each other when the flexible display panel 11 is in the flat state. The hinge portions 13 (specifically, four sets of the hinge portions 13) are arranged in the long-side direction (the Y-axis direction) of each display support portion 12 at intervals. Accordingly, each display support member 12 is supported stably and rotatable by the hinge portions 13 that are arranged at intervals with respect to the long-side direction of the display support portion 12. The hinge portion 13 includes hinge parts 15, 16 (a first hinge part 15 and a second hinge part 16) that are mounted on the respective display support portions 12 that are adjacent to each other when the flexible display panel 11 is in the flat state. The hinge parts 15, 16 are made of metal and fixed to the respective display support portions 12 with a fixing member such as a screw. Specifically, as illustrated in FIGS. 3 and 4, the hinge parts 15, 16 include mount portions 15a, 16a and rotation portions 15b, 16b, respectively. The mount portions 15a, 16a are mounted on the corresponding display support portions 12, respectively, and the rotation portions 15b, 16b that are overlapped with each other, respectively. The rotation portion 15b is continuous from the mount portion 15a and the rotation portion 16b is continuous from the mount portion 16a. Each of the mount portions 15a, 16a is a plate member having a plate surface along an opposite surface 12b that is opposite to the support surface 12a of each display support portion 12. Each of the rotating portions 15b, 16b is a plate member having a plate surface that is perpendicular to the plate surface of each mounting portion 15a, 16a and along an arrangement direction (X-axis direction) in which the display support portions 12 are arranged. The rotating portions 15b, 16b are overlapped with each other in most areas thereof and a rotation shaft portion 17 is inserted through a rotation center of the rotating portions 15b, 16b. The rotation shat portion 17 restricts the overlapped plate surfaces of the rotating portions 15b, 16b from being separated from each other and the rotating portions 15b, 16b are rotated around the rotation shaft portion 17 along the plate surfaces thereof. The rotation shaft portion 17 may be formed integrally with one of the rotating portions 15b, 16b or may be a separate part from the hinge parts 15, 16.

In the related art, a part of the hinge portion projects toward the flexible display panel and the hinge portion includes a projected shaft portion in the projected portion thereof. The flexible display panel is directly wound around the projected shaft portion. Therefore, the projected shaft portion obstructs the user's view when the user sees an image displayed on the image surface of the flexible display panel and design properties of the display device may be deteriorated. To solve such problems, in the present embodiment, as illustrated in FIG. 3, the hinge portion 13 includes an angle restricting portion 18. The angle restricting portion 18 restricts an angle formed by the display support portions 12 that are rotated according to the bending of the flexible display panel 11 from the flat state. The angle restricting portion 18 is included in each of the hinge parts 15, 16 of the hinge portion 13. The angle restricting portion 18 includes a stopper projection 19 and a stopper hole 20 (a pair of stopper portions) that are stopped by each other if the angle formed by the display support portions 12 that are rotated reaches a predetermined value (see FIG. 7). Accordingly, the stopper projection 19 and the stopper hole 20 of the angle restricting portion 18 are less likely to obstruct the user's view when the user sees an image displayed on the image surface 11a of the flexible display panel 11, and design properties of the display device 10 may be improved. Hereinafter, the angle restricting portion 18 will be described in detail.

As illustrated in FIG. 3, all of the hinge portions 13 included in the display device 10 have the angle restricting portions 18, respectively, and accordingly, an impact force acting on the angle restricting portions 18 when restricting the angle is dispersed. All of the hinge portions 13 have a common configuration and a manufacturing cost can be reduced. The angle restricting portion 18 includes the stopper projection 19 and the stopper hole 20. The stopper projection 19 is included in the rotating portion 15b of the first hinge part 15. The stopper hole 20 is included in the rotating portion 16b of the second hinge part 16. The stopper projection 19 projects from the rotating portion 15b of the first hinge part 15 toward the rotating portion 16b of the second hinge part 16. The stopper projection 19 has a columnar shape. The stopper hole 20 is formed by partially cutting off the rotating portion 16b of the second hinge part 16. The stopper projection 19 is inserted through the stopper hole 20. The stopper hole 20 is substantially an elongated hole in a plan view of the rotating portion 16b and has a hole edge extending along a longitudinal direction thereof. The hole edge has a substantially arc shape having a rotation center that is coaxial with the rotation center of the hinge portion 13. The hole edge of the stopper hole 20 extending in the longitudinal direction is along an outer peripheral surface of the rotation shaft portion 17. The stopper hole 20 has a width slightly greater than a diameter of the stopper projection 19. According to such a configuration, the stopper projection 19 can be inserted through the stopper hole 20 and is movable within the stopper hole 20.

Figure 6:
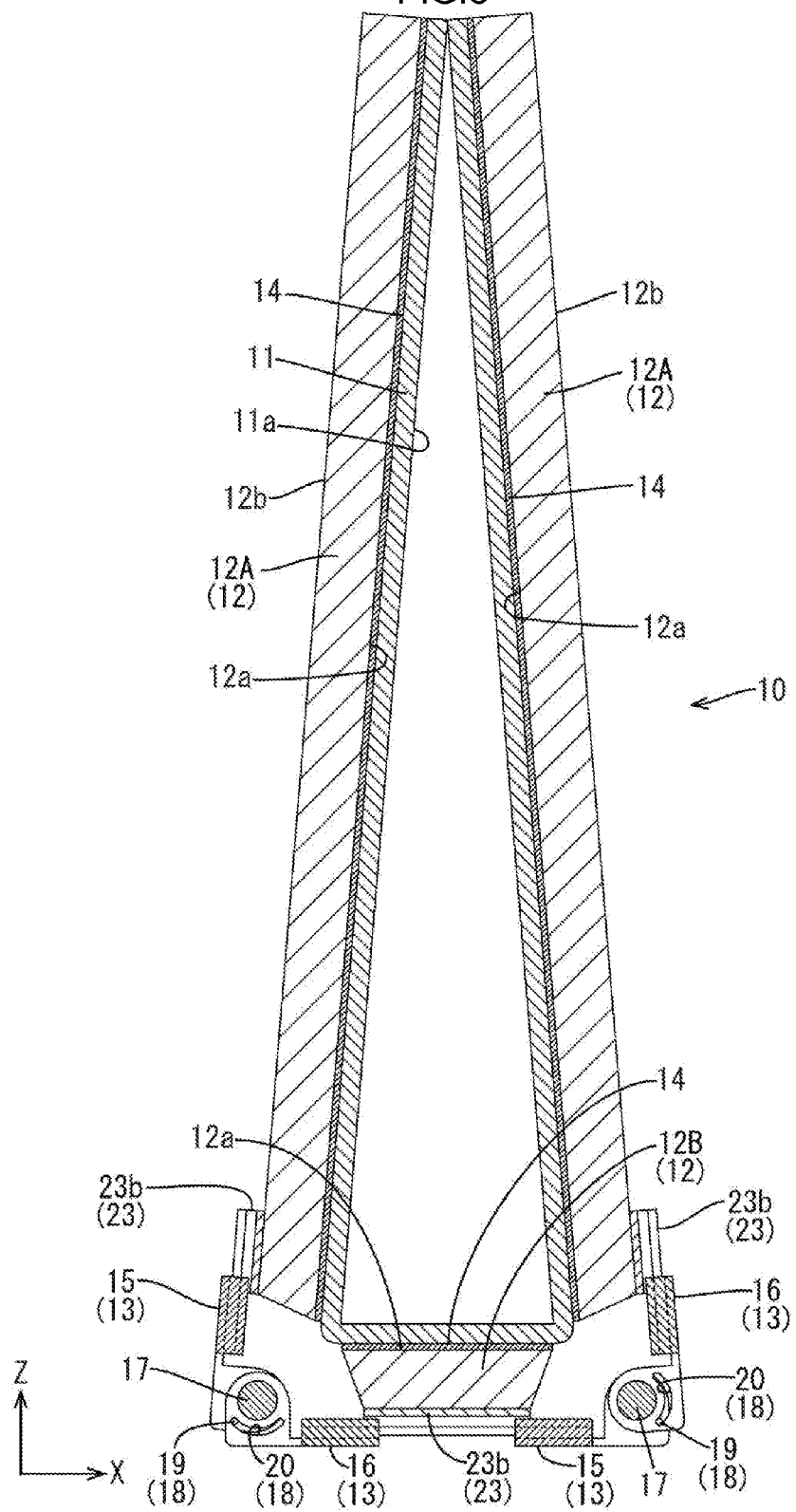
FIG. 6 is a side cross-sectional view of the flexible display panel in a folded state.
Figure 7:
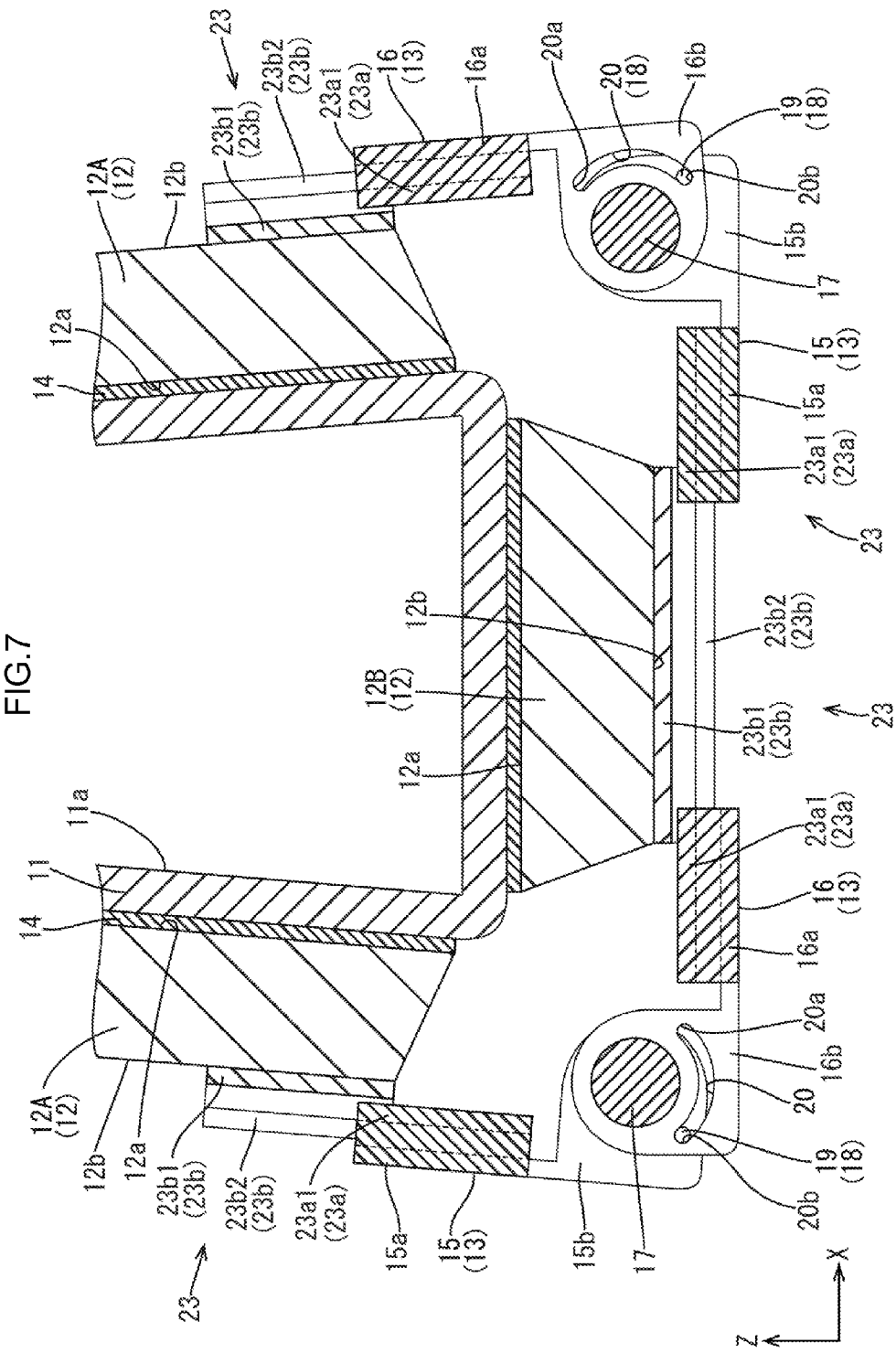
FIG. 7 is a side cross-sectional view of the flexible display panel in the folded state including the hinge portion and the angle restricting portion.

As illustrated in FIG. 3, the stopper projection 19 is movable from a position where the stopper projection 19 is in contact with the first hole edge 20a that is one edge side of the stopper hole 20 with respect to the elongated direction thereof to a position where the stopper projection 19 is in contact with the second hole edge 20b that is another edge side of the stopper hole 20 (see FIG. 7). Thus, the stopper projection 19 is movable along the elongated direction within the stopper hole 20. The movement of the stopper projection 19 is guided by the hole edge of substantially arc shape along the elongated direction of the stopper hole 20. Namely, a movable range of the stopper projection 19 is restricted by the length of the stopper hole 20 and is from a first position (illustrated in FIG. 3) where the stopper projection 19 is in contact with the first hole edge 20a of the stopper hole 20 to a second position (illustrated in FIG. 7) where the stopper projection 19 is in contact with the second hole edge 20b. When the stopper projection 19 is in the first position, as illustrated in FIG. 3, the plate surfaces of the display support portions 12 are aligned with each other (form a straight angle) and flexible display panel 11 is in the flat state. Namely, since the stopper projection 19 is in contact with the first hole edge 20a of the stopper hole 20, the display support portions 12 are not rotated further from the flat state where the plate surfaces of the display support portions 12 are aligned to a state where the plate surfaces thereof form a major angle (the display surface 11a of the flexible display panel 11 forms a major angle). Accordingly, the flexible display panel 11 is not deformed to be warped in a way opposite to that the flexible display panel 11 is folded such that the display surface 11a faces a folded inner side. If the stopper projection 19 that is in contact with the first hole edge 20a of the stopper hole 20 is moved toward the second hole edge 20b, the display support portions 12 are rotated from the state where the plate surfaces of the display support portions 12 are aligned with each other to a state where the plate surfaces form a minor angle (the display surface 11a of the flexible display panel 11 forms a minor angle). As illustrated in FIGS. 6 and 7, since the stopper projection 19 is in contact with the second hole edge 20b of the stopper hole 20 in a folded state, the adjacent display support portions 12 are not rotated further from the folded state such that an angle formed by the plate surfaces of the adjacent display support portions 12 is not greater than a predetermined value. The predetermined value of the angle is determined so that the plastic deformation is not caused in a bending portion of the flexible film of the flexible display panel 11 and mechanical damage is not caused in the components such as organic LEDs, the TFTs, and traces mounted on the flexible film. Accordingly, the flexible display panel 11 may not be damaged by excessive bending of the flexible display panel 11. The predetermined value of the angle may be altered by changing the length of the stopper hole 20 or the arrangement of the stopper projection 19, if necessary.

Figure 5:
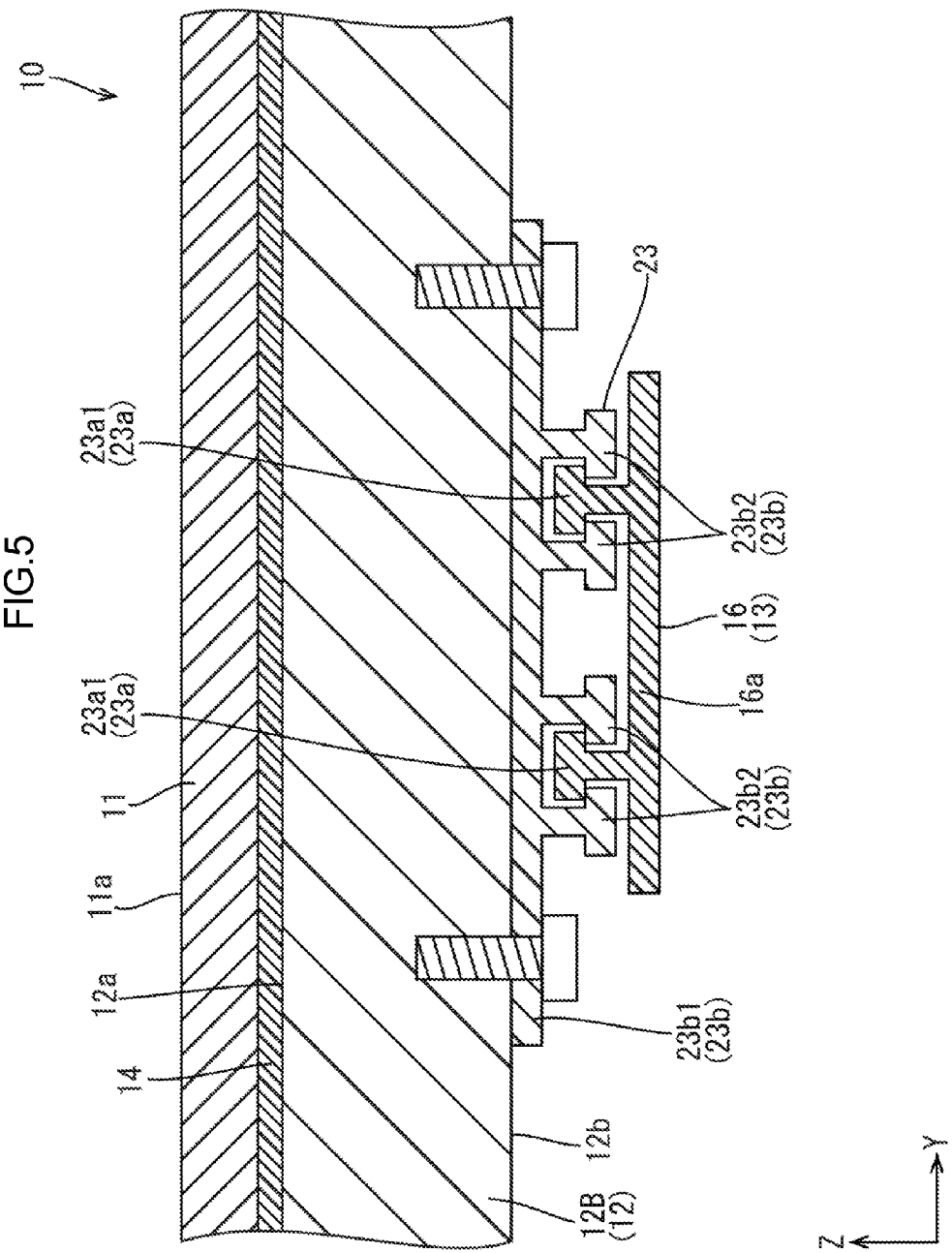
FIG. 5 is a cross-sectional view taken along line v-v in FIG. 4.

Further, as illustrated in FIGS. 4 and 5, a slide portion 23 is mounted on the hinge portion 13, and the two adjacent display support portions 12 that are rotatably supported by the hinge portion (the adjacent main display support portion 12A and the sub-display support portion 12B). The adjacent display support portions 12 slide with respect to the hinge portion 13 via the slide portion 23. The slide portion 23 includes a hinge portion side slide portion 23a and a support portion side slide portion 23b. The hinge portion side slide portion 23a is mounted on each of the hinge parts 15, 16 of the hinge portion 13. The support portion side slide portion 23b is mounted on each of the two adjacent display support portions 12. The hinge portion side slide portions 23a are integrally formed with the respective hinge parts 15, 16. Specifically, the hinge portion side slide portion 23a includes slide rail portions 23a1 that project from a plate surface of each mounting portion 15a, 16a. The slide rail portion 23a1 projects from the plate surface opposite the display support portion 12. The slide rail portions 23a1 extend in the X-axis direction that is a sliding direction when the flexible display panel 11 is in the flat state. The slide rail portions 23a1 project from the respective mounting portions 15a, 16a and each of the slide rail portions 23a1 has a projected distal end portion extending laterally and having a cross sectional T-shape. The two slide rail portions 23a1 are arranged on the respective mounting portions 15a, 16a parallel to each other along the Y-axis direction at an interval. The support portion side sliding portion 23b is a separate part from the display support portion 12 and includes a support portion side slide main part 23b1 and a rail receiving portion 23b2. The support portion side slide main part 23b1 is mounted on an outer surface of the display support portion 12. The rail receiving portion 23b2 receives the slide rail portion 23a1. The support portion side slide main part 23b1 has a plate shape having a plate surface facing the outer surface of the display support portion 12 and is fixed to the display support portion 12 with a fixing member such as a screw. The rail receiving portion 23b2 includes a pair of projections projecting from the outer surface of the support portion side sliding main part 23b1 toward the mounting portions 15a, 16a. The projections are arranged in the Y-axis direction at an interval and have a rail receiving space therebetween for receiving the slide rail portion 23a1. Each of the projections of the rail receiving portion 23b2 extends in the X-axis direction that is the sliding direction when the flexible display panel 11 is in the flat state. Each of the projections has a projected distal end portion extending laterally and having a cross sectional T-shape. Extended portions of a pair of the projections included in the rail receiving portion 23b2 and extended portions of the slide rail portion 23a1 slide along each other so that the adjacent two display support portions 12 can move to be closer to each other or away from each other with respect to the hinge portion 13. Two rail receiving portions 23b2 (a rail receiving portion 23b2 including a pair of projections) are arranged in the Y-axis direction to be parallel to each other at an interval. The support portion side slide main part 23b1 is mounted on each of the main display support portions 12A. The support portion side slide main part 23b1 is mounted on the sub-display support portion 12B to cover almost entire width thereof. The support portion side slide main part 23b1 on the sub-display support portion 12B commonly receives the slide rail portions 23a1 of the two hinge portions 13. Namely, the commonly used support side slide main part 23b1 of the sub-display support portion 12B receives the slide rail portion 23a1 of the second hinge part 16, which is one of the two hinge portions 13 (a left one in FIGS. 3 and 7), and the slide rail portion 23a1 of the first hinge part 15, which is another one of the two hinge portions 13 (a right one in FIGS. 3 and 7).

As illustrated in FIGS. 3 and 7, the two adjacent display support portions 12 are moved around the rotation shaft portion 17 of the hinge portion 13 as a rotation center. The rotation shaft 17 is near a middle portion of the display support portion 12 with respect to the thickness thereof. In a configuration without having the above-described sliding portions, if the two adjacent display support portions 12 are moved around the rotation shaft portion 17 as the rotation center, corner portions of opposed surface 12c side edge portions near the flexible display panel 11 are closer to each other. In the configuration including the sliding portions 23, the two adjacent display support portions 12 via the hinge portion 13 are moved (slide) away from each other by the sliding portion 23, when the flexible display panel 11 is folded and the two adjacent display support portions 12 are moved around the rotation center. The two adjacent display support portions 12 supporting the flexible display panel 11 are fixed to the flexible display panel 11 via the fixing layer 14. Therefore, the two adjacent display support portions 12 are moved to be away from each other when moved (rotated). More specifically, the two adjacent display support portions 12 slide with the sliding portions 23 so that the corner portions of the opposed surface 12c side edge portions near the flexible display panel 11 are away from each other with a certain distance or more. Accordingly, the corner portions of the two adjacent display support portions 12 are not in contact with each other according to the rotation movement of the display support portions 12 and the rotation movement of the display support portions 12 is not obstructed. When the folded flexible display panel 11 is opened to be the flat state, the two adjacent display support portions 12 via the hinge portion 13 are moved to be closer to each other with the sliding portions 23.

As illustrated in FIGS. 1 and 2, the two adjacent display support portions 12 (the main display support portion 12A and the sub-display support portion 12B) are arranged at a certain clearance C1 between the opposed surfaces 12c thereof when the flexible display panel 11 is in the flat state. The clearance C1 is between the opposed surfaces 12c of the two adjacent display support portions 12 along the long-side of the display support portions 12 with a constant width. The clearance C1 (a distance between the opposed surfaces 12c) is enough for receiving deflection caused in the flexible display panel 11 that is folded according to the rotation movement of the two adjacent display support portions 12. Specifically, positional relation of the two adjacent display support portions 12 is kept constant even if the flexible display panel 11 is folded from the flat state according to the rotational movement of the two adjacent display support portions 12. Namely, the clearance C1 between the opposed surfaces 12c is kept to be a certain distance or more. Therefore, even if deflection may be caused in the folded flexible display panel 11, the deflection is effectively received in the clearance C1. Accordingly, stress that may act on the bending portion of the flexible display panel 11 can be reduced via the clearance C1. The clearance C1 is slightly greater than a width of the rotating portions 15b, 16b of the hinge parts 15, 16 included in the hinge portion 13. Therefore, each of the rotating portions 15b, 16b of the respective hinge parts 15, 16 is arranged within the clearance C1 as a whole. Namely, the clearance C1 is a housing for the rotating portion 15b, 16b. The rotating portions 15b, 16b in the respective clearances C1 are spaced from the flexible display panel 11 and do not project from the support surface 12a of the display support portion 12 toward the flexible display panel 11. The rotating portions 15b, 16b in the respective clearances C1 are arranged spaced (in a recessed position) from the support surface 12a of the display support portion 12 to a side opposite to the flexible display panel 11 side.

As described before, the display device 10 of the present embodiment includes the flexible display panel 11 having flexibility, the display support portions 12, the hinge portion 13, and the angle restricting portion 18. The flexible display panel 11 includes the display surface 11a displaying images. The display support portions 12 are arranged along the display surface 11a of the flexible display panel 11 that is in the flat state and support the flexible display panel 11 from a side opposite to the display surface 11a side. The hinge portion 13 includes at least a pair of hinge parts 15, 16 that are mounted on the respective two adjacent display support portions 12 when the flexible display panel 11 is in the flat state. The hinge portion 13 supports the two adjacent two display support portions 12 rotatably as a rotary axis. The angle restricting portion 18 is mounted on each of the hinge parts 15, 16 and includes at least the stopper projection 19 and the stopper hole 20 (a pair of stopper portions). The stopper projection 19 is stopped in the stopper hole 20 when the flexible display panel 11 is folded from the flat state and the two adjacent display support portions 12 are moved to be rotated and an angle formed by moved two adjacent display support portions 12 reaches a predetermined value. The angle restricting portion 18 restricts the angle.

According to such a configuration, the flexible display panel 11 having flexibility is supported by the display support portions 12, which are arranged along the display surface 11a in the flat state, from the side opposite to the display surface 11a side. The respective hinge parts 15, 16 of the hinge portion 13 are mounted on the respective two display support portions 12 that are adjacent to each other in the flat state of the flexible display panel 11. Accordingly, the two display support portions 12 are rotatably supported by the hinge portion 13. If the flexible display panel 11 that is in the flat state is folded, the two adjacent display support portions 12 are moved and rotated around the hinge portion 13. During the rotation, if the angle formed by the two adjacent display support portions 12 is greater than a predetermined value, the flexible display panel 11 may be damaged. In the present embodiment, if the two adjacent display support portions 12 are rotated according to the folding of the flexible display panel 11, the stopper projection 19 and the stopper hole 20 of the angle restricting portion 18 are stopped by each other so that the angle formed by the two adjacent display support portions 12 does not exceed the predetermined value. The stopper projection 19 is mounted on the hinge part 15 and the stopper hole 20 is formed in the hinge part 16. Thus, the flexible display panel 11 is less likely to be damaged since the angle formed by the two adjacent display support portions 12 according to the rotation thereof is directly restricted by the angle restricting portion 18.

In the related art, the hinge portion includes the projection shaft that the flexible display panel is directly wound around. Therefore, the projection shaft may obstruct a user's view when the user sees an image on the display surface of the flexible display panel and the design properties of the display device may be deteriorated. In the present embodiment, the hinge parts 15, 16 are mounted on the two adjacent display support portions 12, respectively, and the stopper projection 19 on the hinge part 15 and the stopper hole 20 in the hinge part 16 are stopped by each other so that the angle formed by the two adjacent display support portions 12 according to the rotation thereof is restricted. Therefore, the image displayed on the display surface 11a of the flexible display panel 11 is less likely to be obstructed because of the angle restriction portion 18 and the design properties of the display device 10 are improved.

The slide portion 23 is included in each of the two adjacent display support portions 12 and the hinge portion 13, and the two adjacent display support portions 12 slide with respect to the hinge portion 13 via the slide portion 23 according to the rotation of the two adjacent display support portions 12. Accordingly, when the two adjacent display support portions 12 are moved and rotated according to the folding of the flexible display panel 11, the two adjacent display support portions 12 slide with respect to the hinge portion 13 via the slide portion 23. The two adjacent display support portions 12 supporting the flexible display panel 11 slide to be away from each other when moved and rotated.

Accordingly, the two adjacent display support portions 12 are not in contact with each other according to the rotation of the display support portions 12.

The two adjacent display support portions 12 are arranged such that the opposed surfaces 12c are away from each other with the clearance C1 therebetween in the flat state of the flexible display panel 1. Accordingly, in the flat state of the flexible display panel 11, the clearance C1 between the opposed surfaces 12c of the two adjacent support portions 12 is maintained to be a certain distance or more even when the two adjacent display support portions 12 are moved and rotated according to the folding of the flexible display panel 11. The two adjacent display support portions 12 slide with respect to the hinge 13 via the sliding portion 23 such that the clearance C1 is maintained to be the certain distance or more. The clearance C1 can receive the deflection caused in the bending portion of the folded flexible display panel 11. Thus, stress that may act on the bending portion of the flexible display panel 11 can be reduced via the clearance C1.

At least three display support portions 12 are arranged in a row in the flat state of the flexible display panel 11. The display support portions 12 include the main display support portions 12A and the sub-display support portion 12B. The main display support portion 12A supports the flexible display panel 11 with a relatively large support area. The sub-display support portion 12B is between the main display support portions 12A in the flat state of the flexible display panel 11 and supports the flexible display panel 11 with a relatively small support area. According to such a configuration, the flexible display panel 11 is supported by the main display support portions 12A and the sub-display support portion 12B that is between the main display support portions 12A in the flat state of the flexible display panel 11. Therefore, the flexible display panel 11 is bent along at least two bending portions. The flexible display panel 11 is bent in each bending portion at a smaller bending angle so that stress acting on the flexible display panel 11 due to the folding is reduced.

The hinge parts 15, 16 of the hinge portion 13 are mounted on the surfaces 12b of the two adjacent display support portions 12 opposite to support surfaces supporting the flexible display panel 11. If a hinge part is mounted on the support surface 12a of the display support portion 12, the hinge part may be directly in contact with the flexible display panel 11. In the present embodiment, the hinge parts 15, 16 are mounted on the surfaces 12b opposite to the support surfaces 12a of the displays support portions 12 and such a problem may be obviated.

Second Embodiment

A second embodiment will be described with reference to FIG. 8. The second embodiment includes a fixing layer 114 having a different forming area. Similar configurations, operations, and effects to the first embodiment will not be described.

Figure 8:
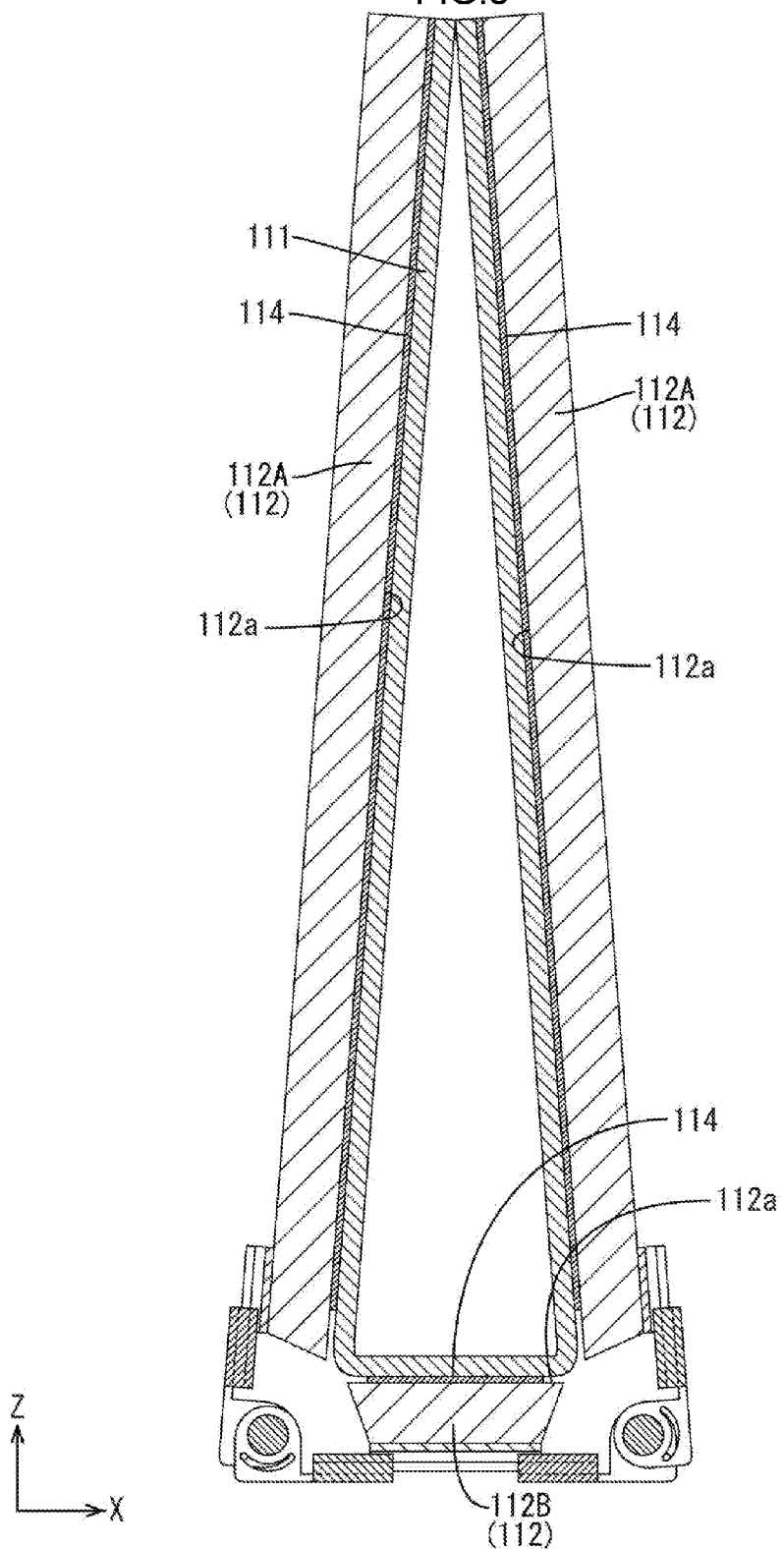
FIG. 8 is a side cross-sectional view of a flexible display panel included in a display device according to a second embodiment of the present technology when the flexible display panel is in a folded state.

As illustrated in FIG. 8, the fixing layer 114 is applied on a most part of a support surface 112a of each display support portion 112 and is not applied on a part of the support surface 112a. Specifically, each of the display support portions 112 has no fixing layer 114 on an end portion thereof near the bending portion of a folded flexible display panel 111. The end portion of the support surface 112a near the bending portion is a fixing layer 114 non-forming area and a most part of the support surface 112a except for the end portion near the bending portion is a fixing layer 114 forming area.

Specifically, the fixing layer 114 non-forming area in each main display support portion 112A is an area of 5 mm from the edge thereof near the bending portion. The fixing layer 114 non-forming area in the sub-display support portion 112B is an area of 2 mm from the edge thereof near the bending portion. When the display support portions 112 are moved and rotated according to the folding of the flexible display panel 11 from the flat state, deflection may be caused in the bending portions of the flexible display panel 111. Even if such deflection is caused, the flexible display panel 111 is likely to be deformed freely according to the deflection because the bending portions of the flexible display panel 111 are not fixed to the display support portions 112 via the fixing layer 114. Accordingly, stress that may be generated by the deformation and the deflection caused in the flexible display panel 111 is less likely to act on the flexible display panel 111.

According to the present embodiment, as described before, the two adjacent display support portions 112 are fixed to the flexible display panel 111 with the support surfaces 112a opposed to the flexible display panel 111 except for the end portions of the support surfaces 112a near the bending portions of the flexible display panel 111 in the folded state. According to such a configuration, the support surfaces 112a of the two adjacent display support portions 112 are fixed to the flexible display panel 111 so that the folding operation of the flexible display panel 111 follows the rotation operation of the adjacent two display support member 112. When the flexible display panel 111 is folded from the flat state, deflection may be caused in the bending portion. In such a case, the two adjacent display support portions 112 allow deformation and deflection of the flexible display panel 111 caused in the bending portion in folding of the flexible display panel 111, since the portions of the support surfaces 112a except for the end portions of the support surfaces 112a near the bending portion of the folded flexible display panel 111 are fixed to the flexible display panel 111.

Third Embodiment

A third embodiment of the present technology will be described with reference to FIGS. 9 to 11. In the third embodiment, the number of display support portions 212 is altered from that in the first embodiment. Similar configurations, operations, and effects to the first embodiment will not be described.

Figure 9:
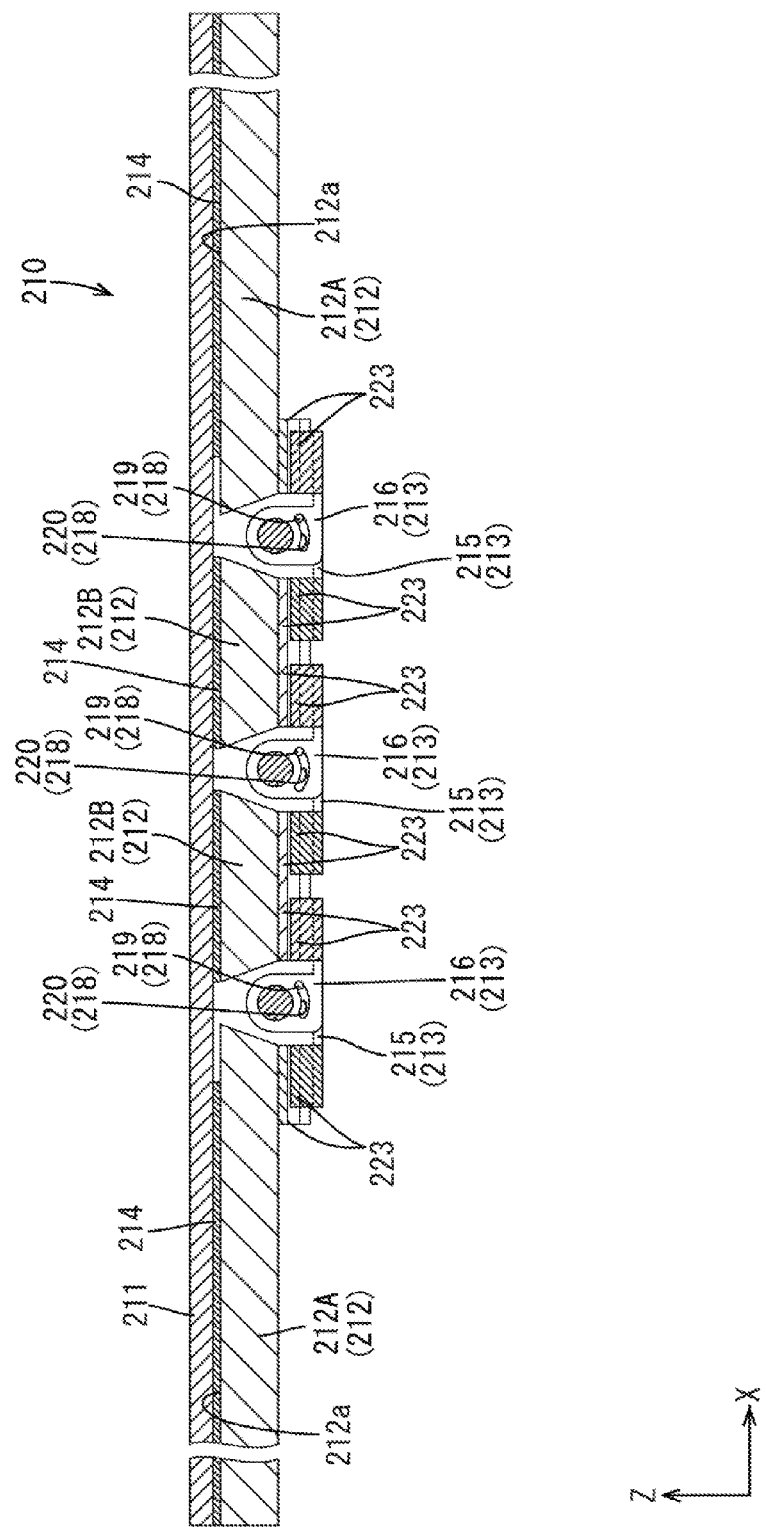
FIG. 9 is a side cross-sectional view of a flexible display panel included in a display device according to a third embodiment of the present technology when the flexible display panel is in a folded state.
Figure 10:
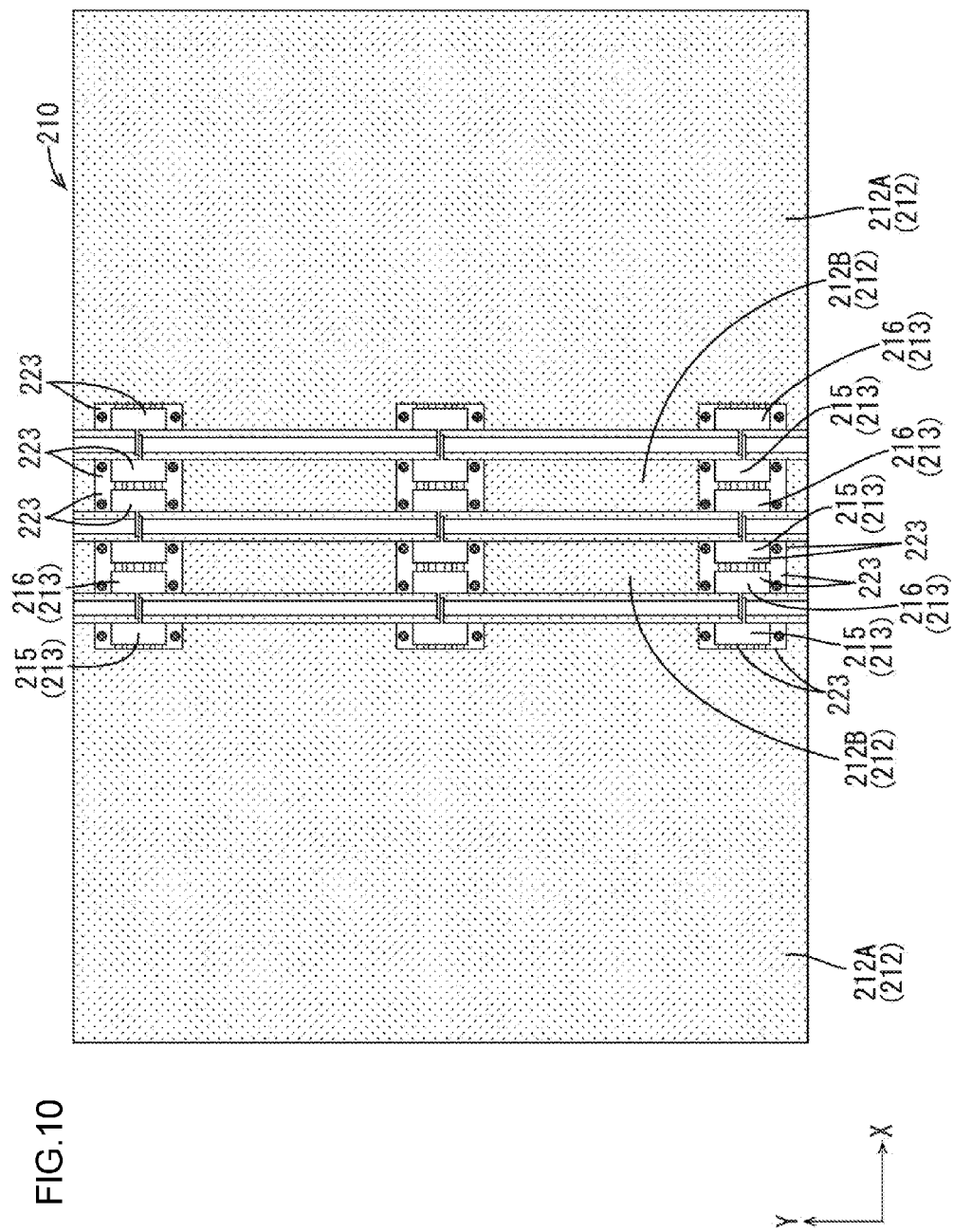
FIG. 10 is a bottom view of the flexible display panel in a flat state.
Figure 11:
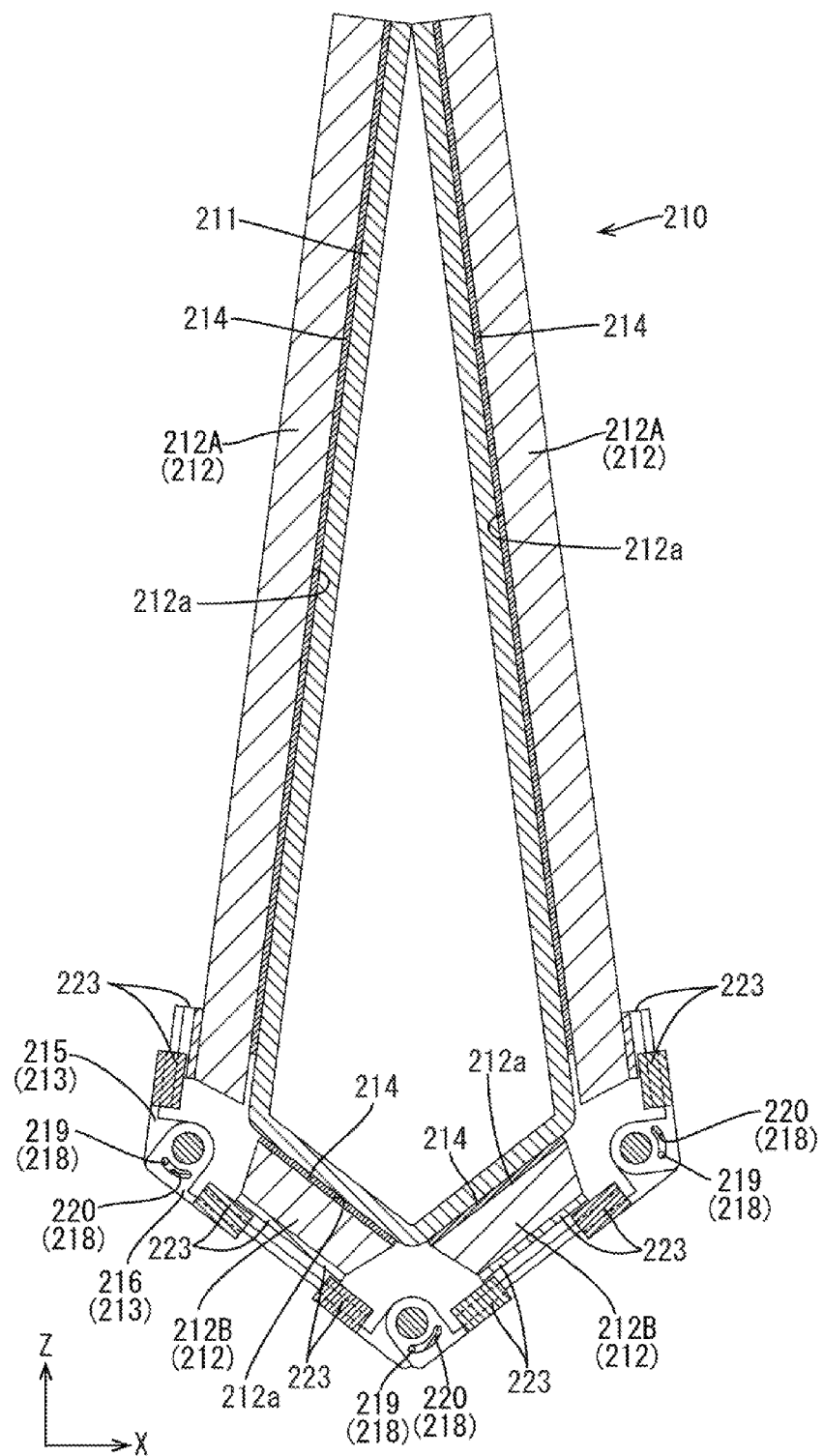
FIG. 11 is a side cross-sectional view of the flexible display panel in the folded state.

As illustrated in FIGS. 9 and 10, a display device 210 of the present embodiment includes four display support portions 212 that are arranged in a row when a flexible display panel 211 is in a flat state. The flexible display panel 211 that is supported by the four display support portions 212 is bent at borders of the display support portions 212. In the present embodiment, the flexible display panel 211 has three bending portions (see FIG. 11). The four display support portions 212 include two main display support portions 212A and two sub-display support portions 212B, and the two sub-display support portions 212B are arranged between the two main display support portions 212A. Among the four display support portions 212, each of the two sub-display support portions 212B is fixed to the flexible display panel 211 with a substantially entire area of each support surface 212a thereof via a fixing layer 214. Each of the two main display support portions 212A is fixed to the flexible display panel 211 with each support surface 212a thereof via the fixing layer 214 and a part of each support surface 212a is not fixed to the flexible display panel 211. Each main display support portion 212A includes a fixing layer 214 non-forming area in an end portion of the support surface 212a near the adjacent sub-display support portion 212B, similarly to the configuration of the second embodiment. Most portion of the support surface 212a except for the fixing layer 213 non-forming area is a fixing layer 214 forming area. In FIG. 10, each display support portion 212 is illustrated with shading.

The display support portions 212 that are adjacent to each other in the flat state of the flexible display panel 211 include a first hinge part 215 and a second hinge part 216 of a hinge portion 213, respectively. Accordingly, the adjacent display support portions 212 are moved and rotated according to bending of the flexible display panel 211. Three hinge portions 213 are arranged in a direction in which the display support portions 212 are arranged (the X-axis direction). The hinge portions 213 include one that rotatably supports adjacent main display support portion 212A and the sub-display support portion 212B and another one that rotatably supports adjacent two sub-display support portions 212B. Four hinge portions 213 of the former type are arranged in the Y-axis direction at intervals and three hinge portions 213 of the latter type are arranged in the Y-axis direction at intervals.

As illustrated in FIGS. 9 and 10, each of the hinge portions 213 includes an angle restricting portion 218. The angle restricting portion 218 restricts an angle formed by the display support portions 212 that are rotated according to the bending of the flexible display panel 211 from the flat state. The angle restricting portion 218 is included in each of the hinge parts 215, 216 of the hinge portion 213. The angle restricting portion 218 includes a stopper projection 219 and a stopper hole 220 that are stopped by each other if the angle formed by the display support portions 212 that are rotated reaches a predetermined value (see FIG. 11). As illustrated in FIG. 11, when the flexible display panel 211 is folded, the display device 210 of the present embodiment includes three bending portions. The number of the bending portions is greater than that in the first embodiment. Accordingly, the predetermined angle that is formed by the display support portions 212 and restricted by the angle restricting portion 218 is smaller than that of the first embodiment. To reduce the predetermined value of the angle, the length of the stopper hole 220 of the angle restricting portion 218 is smaller than that in the first embodiment. A slide portion 223 is mounted on the main display support portion 212A and the sub-display support portion 212B that are adjacent to each other, and the hinge portion 213 that rotatably supports the adjacent main display support portion 212A and the sub-display support portion 212B. Another slide portion 223 is mounted on the two adjacent sub-display support portions 212B and the hinge portion 213 that rotatably supports the adjacent sub-display support portions 212B.

The display device 210 of the present embodiment has a short-side dimension of approximately 182 mm and a long-side dimension of approximately 257 mm and has a B5 size. Each of the display support portions 212 has a thickness of approximately 5 mm. Each of the main display support portions 212A has a short-side dimension of approximately 123 mm and a long-side dimension of approximately 182 mm. Each of the sub-display support portions 212B has a short-side dimension of approximately 5 mm and has a long-side dimension of approximately 182 mm. Each of the main display support portions 212A has a fixing layer 214 non-forming area that is an area of 5 mm from the end thereof near the bending portion of the flexible display panel 211.

As described before, according to the present embodiment, the sub-display support portions 212B are arranged adjacent to each other in the flat state of the flexible display panel 211. According to such a configuration, the sub-display support portions 212B each of which has a relatively small support area supporting the flexible display panel 211 in the flat state are arranged adjacent to each other so that the bending portions in the folded state of the flexible display panel 211 have greater curvature. Thus, stress that may act on the flexible display panel 211 according to the bending is reduced.

Fourth Embodiment

A fourth embodiment of the present technology will be described with reference to FIGS. 12 and 13. In the fourth embodiment, the number of display support portions 312 is altered from that in the third embodiment. Similar configurations, operations, and effects to the third embodiment will not be described.

Figure 12:
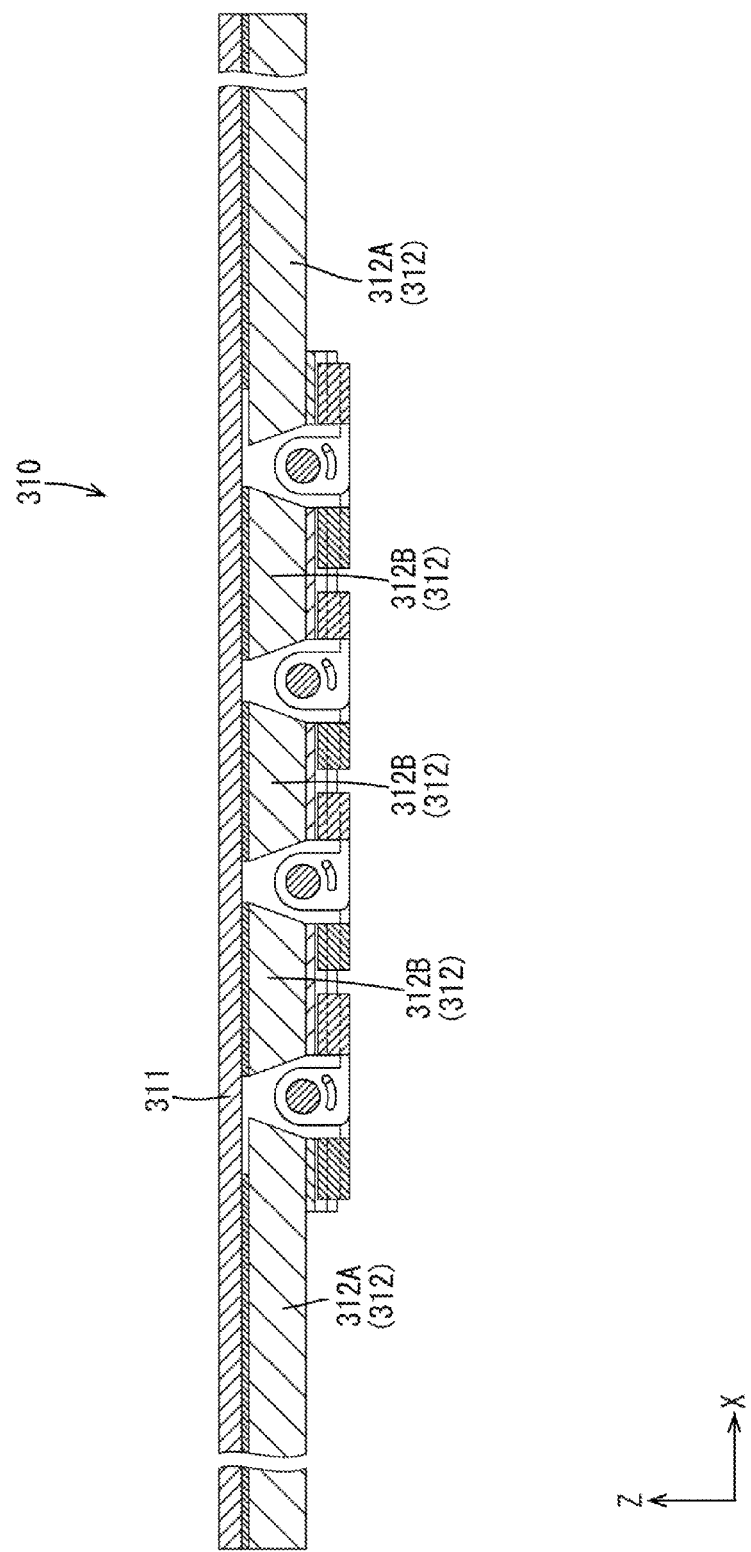
FIG. 12 is a side cross-sectional view of a flexible display panel included in a display device according to a fourth embodiment of the present technology when the flexible display panel is in a flat state.
Figure 13:
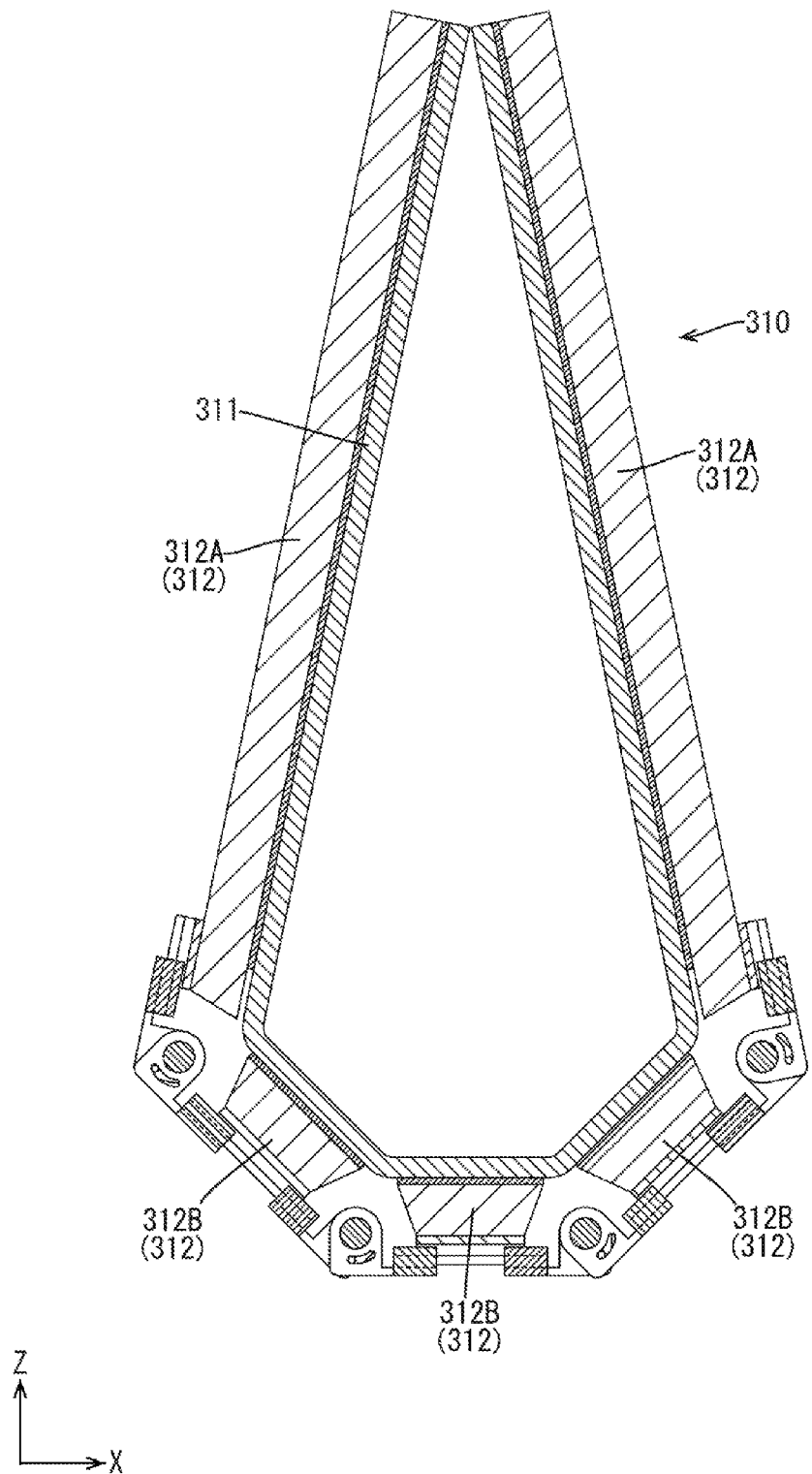
FIG. 13 is a side cross-sectional view of the flexible display panel in the folded state.

As illustrated in FIGS. 12 and 13, a display device 310 of the present embodiment includes five display support portions 312 that are aligned with each other in the flat state of a flexible display panel 311. The flexible display panel 311 supported by the five display support portions 312 is bendable at borders of the display support portions 312. In the present embodiment, the flexible display panel 311 has four bending portions (see FIG. 13). The five display support portions 312 include two main display support portions 312A and three sub-display support portions 312B that are arranged between the two main display support portions 312A. The three sub-display support portions 312B are arranged adjacent to each other. Namely, the display device of the present embodiment includes one more sub-display support portion 312B in addition to that of the third embodiment.

Fifth Embodiment

A fifth embodiment of the present technology will be described with reference to FIGS. 14 and 15. In the fifth embodiment, the number of display support portions 412 is altered from that in the first embodiment. Similar configurations, operations, and effects to the first embodiment will not be described.

Figure 14:
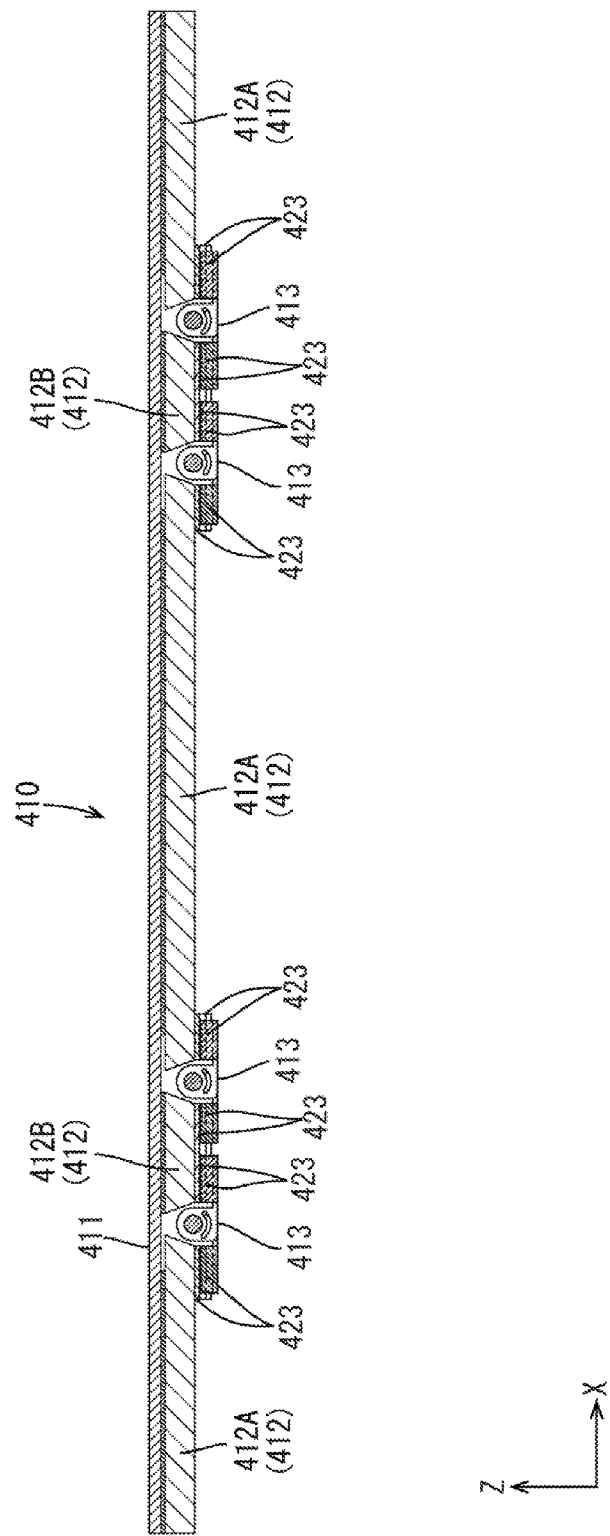
FIG. 14 is a side cross-sectional view of a flexible display panel included in a display device according to a fifth embodiment of the present technology when the flexible display panel is in a flat state.
Figure 15:
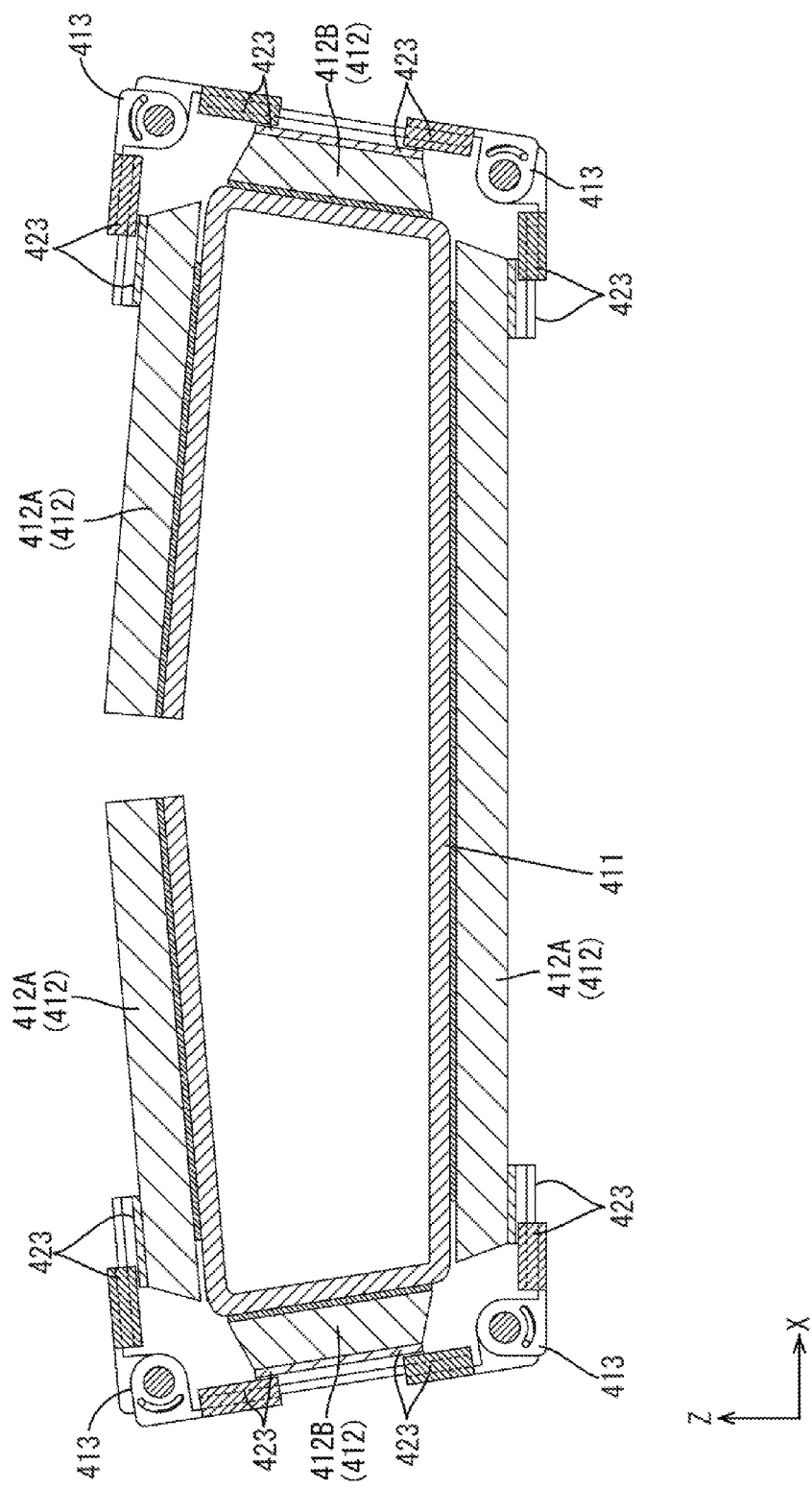
FIG. 15 is a side cross-sectional view of the flexible display panel in the folded state.

As illustrated in FIG. 14, a display device 410 of the present embodiment includes five display support portions 412 that are aligned with each other in the flat state of a flexible display panel 411. The flexible display panel 411 supported by the five display support portions 412 is bendable at borders of the display support portions 412. In the present embodiment, the flexible display panel 411 has four bending portions (see FIG. 15). The five display support portions 412 include three main display support portions 412A and two sub-display support portions 412B that are arranged between the three main display support portions 412A, respectively. The three main display support portions 412A have two different sizes. One of the main display support portions 412A has a largest support area supporting the flexible display panel 411 and is arranged in a middle portion with respect to the long-side direction of the flexible display panel 411. Two of the main display support portions 412A have a support area smaller than that of the one main display support portion 412A. Each of the two main display support portions 412A having a relatively small support area is arranged on each side end with respect to the long-side direction of the flexible display panel 411. Each of the two sub-display support portions 412B is arranged between the end side main display support portion 412A and the middle main display support portion 412A. Hinge portions 413 are mounted on the respective display support portions 412 (the main display support portion 412A and the sub-display support portion 412B) that are adjacent to each other in the flat state of the flexible display panel 411. According to such a configuration, the adjacent display support portions 412 are moved and rotated according to the bending of the flexible display panel 411. Slide portions 423 are mounted on the respective adjacent display support portions 412 (main display support portion 412A and the sub-display support portion 412B) that are adjacent to each other and the hinge portion 413 that rotatably supports the adjacent display support portions 412. In the display device 410 of the present embodiment, with such a configuration, the two end side main display support portions 412A are moved and rotated from the flat state of the flexible display panel 411 so as to be opposed to the middle main display support portion 412A. Accordingly, the entire display device 410 is folded as illustrated in FIG. 15. The display device 410 is folded like hinged double doors.

Sixth Embodiment

A sixth embodiment will be described with reference to FIGS. 16 and 17. In the sixth embodiment, a spacer 22 is arranged between two sub-display support portions 512B in the configuration of the third embodiment. Similar configurations, operations, and effects to the third embodiment will not be described.

Figure 16:
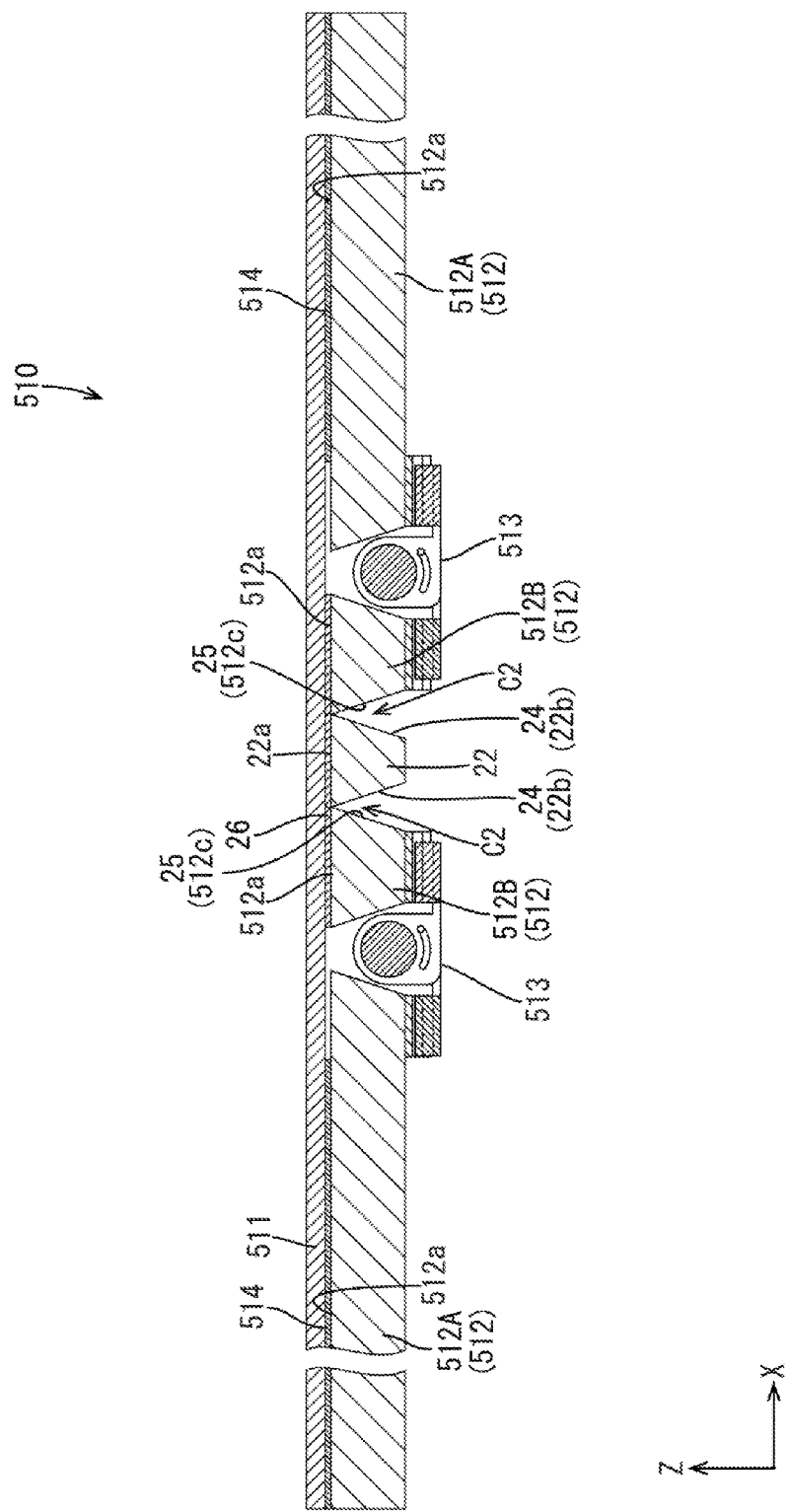
FIG. 16 is a side cross-sectional view of a flexible display panel included in a display device according to a sixth embodiment of the present technology when the flexible display panel is in a flat state.
Figure 17:
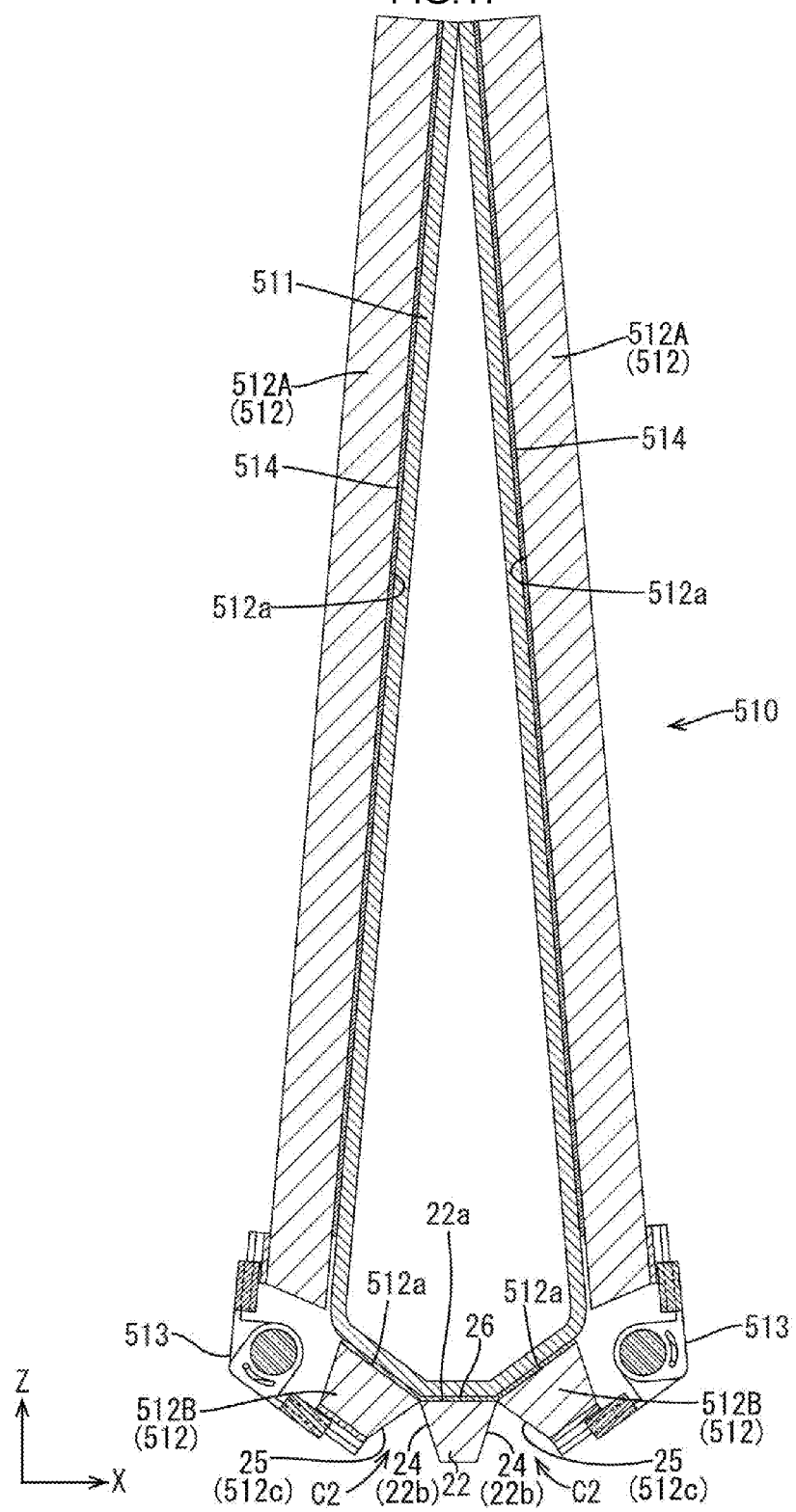
FIG. 17 is a side cross-sectional view of the flexible display panel in the folded state.

As illustrated in FIG. 16, a display device 510 of the present embodiment includes the spacer 22 between two sub-display support portions 512B that are arranged in a middle with respect to a long-side direction of a flexible display panel 511 in the flat state. The spacer 22 is made of a material same as that of each display support portion 512 and has a rectangular plan view shape. The spacer 22 has a long-side dimension, a short-side dimension, and a thickness that are substantially same as respective ones of the sub-display support portion 512B. Two main display support portions 512A have support surfaces 512a and each of the main display support portions 512A is fixed to the flexible display panel 511 via a fixing layer 514 with a portion of the support surface 512A except for end portions opposite the sub-display support portions 512B. The two sub-display support portions 512B and the spacer 22 are not fixed to the flexible display panel 511 with an entire area of the support surfaces 512a. The two sub-display support portions 512B are connected to the respective main display support portions 512A so as to be rotatably supported via a hinge portion 513. The two sub-display support portions 512B are connected to the spacer 22 that is between the two sub-display support portions 512B via a flexible plate member 26 so as to be relatively rotatable. The flexible plate member 26 is a thin plate made of synthetic resin or metal and has effective flexibility similar to a flexible film of the flexible display panel 511. The flexible plate member 26 is mounted on the support surfaces 512a of the sub-display support portions 512B and a support surface 22a of the spacer 22 supporting the flexible display panel 511.

As illustrated in FIG. 16, the spacer 22 has a substantially trapezoidal cross-sectional shape taken along a direction in which the display support portions 512 are arranged (the X-axis direction). The spacer 22 has opposed surfaces 22b each facing the adjacent sub-display support portion 512B. The opposed surfaces 22b are sloped surfaces 24. The sub-display support portion 512B has an opposed surface 512c and the spacer 22 is between the sub-display support portions 512B to have a clearance C2 between the opposed surfaces 22b (the sloped surfaces 24) and the opposed surfaces 512c of the sub-display support portion 512B, respectively. The sloped surface 24 is sloped such that the clearance C2 (a distance between the opposed surfaces 22b and 512c) gradually increases as is farther away from the flexible panel 511 with respect to a direction in which the flexible display panel 511 and the display support portions 512 are overlapped (in the Z-axis direction in FIG. 16). The sub-display support portions 512B adjacent to the spacer 22 have the opposed surfaces 512c opposite the spacer 22 and the opposed surfaces 512c are sloped surfaces 25. The sloped surface 25 is sloped such that the clearance C2 gradually increases as is farther away from the flexible panel 511 with respect to the direction in which the flexible display panel 511 and the display support portions 512 are overlapped. The sloped surfaces 24, 25 have a substantially same inclination angle. Therefore, the clearance C2 is surrounded by an isosceles triangular shape with a side view in the flat state of the flexible display panel 511. The clearance C2 gradually increases as the flexible display panel 511 is folded from flat state (see FIG. 17). When the folding is completed, the two sub-display support portions 512B and the spacer 22 therebetween are arranged as appropriate according to the shape of the bending portion of the flexible display panel 511, and the curvature of the bending portion of the flexible display panel 511 is greater.

The display device 510 of the present embodiment has a short-side dimension of approximately 257 mm and a long-side dimension of approximately 364 mm and has a B4 size. Each of the display support portions 512 has a thickness of approximately 8 mm. Each of the main display support portions 512A has a short-side dimension of approximately 177 mm and a long-side dimension of approximately 257 mm. Each of the sub-display support portions 512B has a short-side dimension of approximately 10 mm and has a long-side dimension of approximately 257 mm. The spacer 22 has a short-side dimension of approximately 10 mm and a long-side dimension of approximately 257 mm. The hinge portion 513 has an axial diameter of approximately 6 mm. In a modified example of the present embodiment, an end portion of the main display support portion 512A near the sub-display support portion 512B may not be fixed to the flexible display panel 511 (for example, a width of 7 mm may be unfixed).

As is described before, according to the present embodiment, the display device includes multiple sub-display support portions 512B and the spacer 22 that is between the multiple sub-display support portions 512B in the flat state of the flexible display panel 511. According to such a configuration, the spacer 22 is between the multiple sub-display support portions 512B in the flat state of the flexible display panel 511, and thus, the curvature of the bending portions of the folded flexible display panel 511 can be greater.

In the flat state of the flexible display panel 11, the sloped surface 25 is formed on at least one of the opposed surfaces 22b of the spacer 22 and the opposed surfaces 512c of the sub-display support portions 512 that are facing each other. The sloped surface 25 is inclined such that the distance between the opposed surfaces 22b, 512c gradually increases as is farther away from the flexible display panel 511 with respect to the direction in which the flexible display panel 511 and the display support portions 512 are overlapped. According to such a configuration, at least one of the opposed surfaces 22b, 512c facing each other between the spacer 22 and the sub-display support portion 512 is the sloped surface 25, and the distance between the opposed surfaces 22b, 512c increases as is farther away from the flexible display panel 511 in the overlapping direction. Therefore, the spacer 22 and the sub-display support portions 512 are easily mounted compared to a configuration that the distance between the opposed surfaces is constant.

Seventh Embodiment

A seventh embodiment will be described with reference to FIGS. 18 and 19. The seventh embodiment differs from the sixth embodiment in that a spacer 622 is connected to a sub-display support portion 612B. Similar configurations, operations, and effects to the sixth embodiment will not be described.

Figure 18:
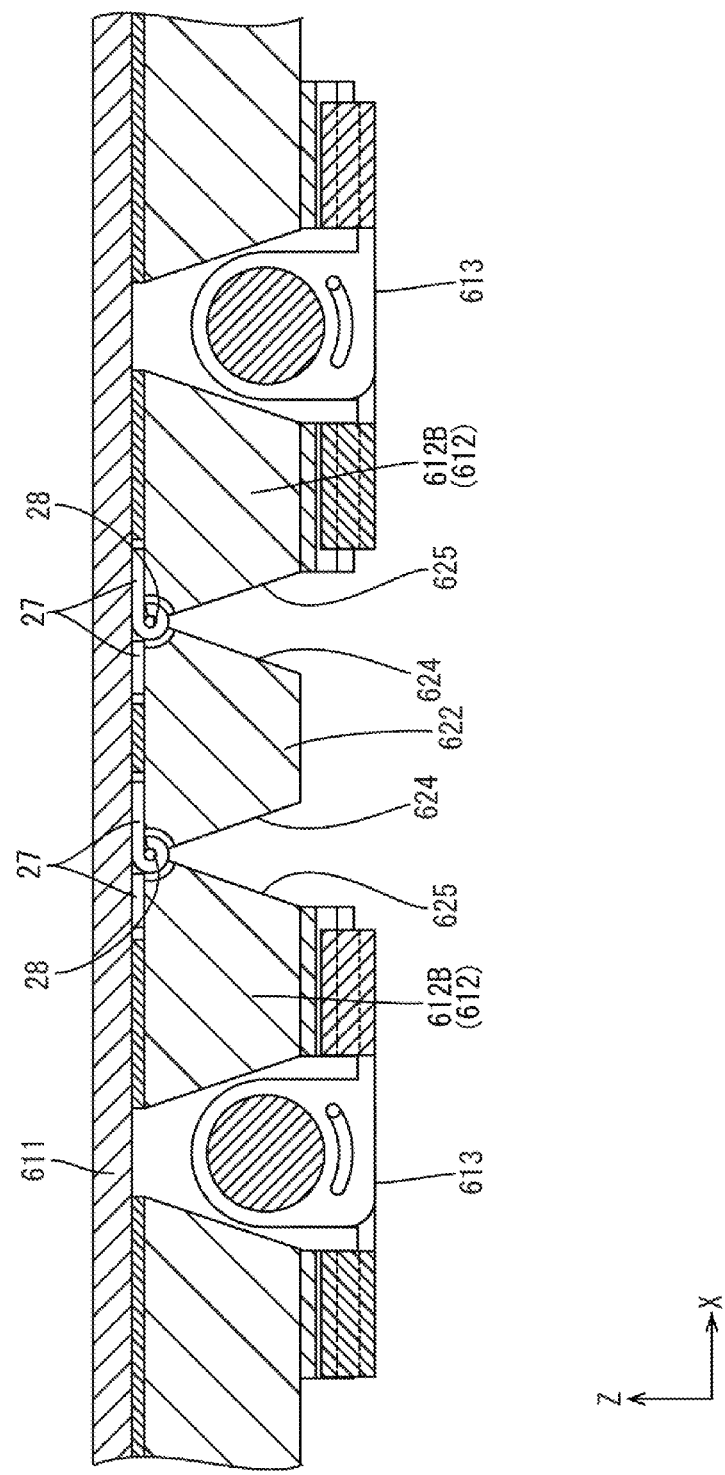
FIG. 18 is an enlarged side cross-sectional view of a flexible display panel included in a display device according to a seventh embodiment of the present technology when the flexible display panel is in a flat state.
Figure 19:
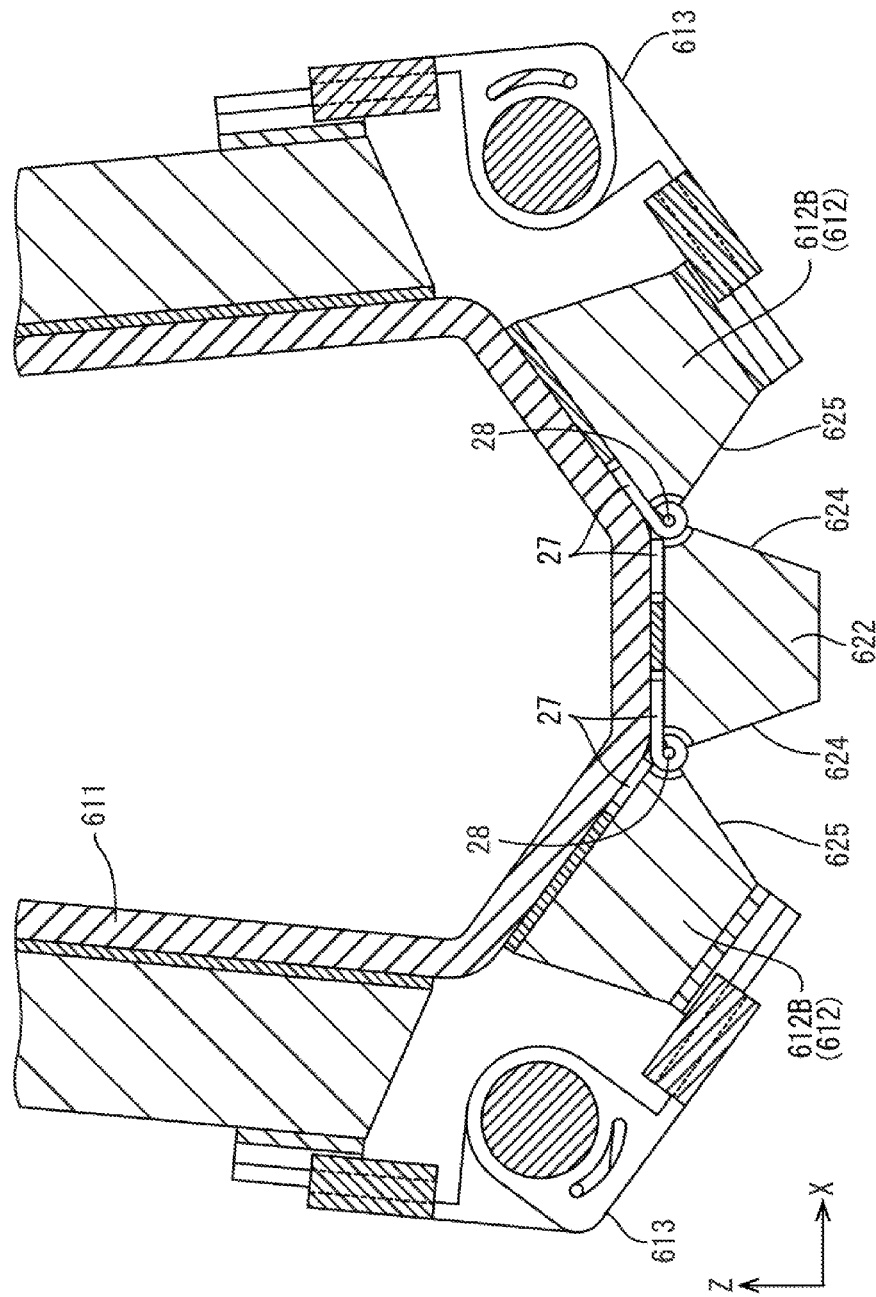
FIG. 19 is an enlarged side cross-sectional view of the flexible display panel in the folded state.

As illustrated in FIGS. 18 and 19, a pair of connecting hinge parts 27 is mounted on a sub-display support portion 612B and the spacer 622 that are adjacent to each other in a flat state of a flexible display panel 611 of the present embodiment. The connecting hinge parts 27 are made of metal similar to the hinge portion 613. One of the hinge parts 27 is mounted on the sub-display support portion 612B and another one of the hinge parts 27 is mounted on the spacer 622. The pair of hinge parts 27 is rotated around a rotary shaft 28 and the sub-display support portion 612B and the spacer 622 can be moved and rotated. The rotary shaft 28 (a rotation center of the pair of hinge parts 27) is arranged on an end portion of each sloped surface 624, 625 of the sub-display support portion 612B and the spacer 622 near the flexible display panel 611. Corner portions of the sub-display support portions 612B and the spacer 622 are cut away. The sub-display support portion 612B and the spacer 622 are fixed to the flexible display panel 611 via the fixing layer.

According to the present embodiment, as described above, a pair of connecting hinge parts 27 is mounted on each of the sub-display support portion 612B and the spacer 622 and the hinge parts 27 rotatably support the sub-display support portion 612B and the spacer 622. According to such a configuration, the sub-display support portion 612B and the spacer 622 where the connecting hinge parts 27 are mounted are moved and rotated, when the flexible display panel 611 is folded. Thus, the sub-display support portion 612B and the spacer 622 are arranged following a shape of bending portions of the flexible display panel 611.

Eighth Embodiment

An eighth embodiment will be described with reference to FIGS. 20 and 21. The eighth embodiment differs from the sixth embodiment in that a spacer 722 is connected to a sub-display support portion 712B. Similar configurations, operations, and effects to the sixth embodiment will not be described.

Figure 20:
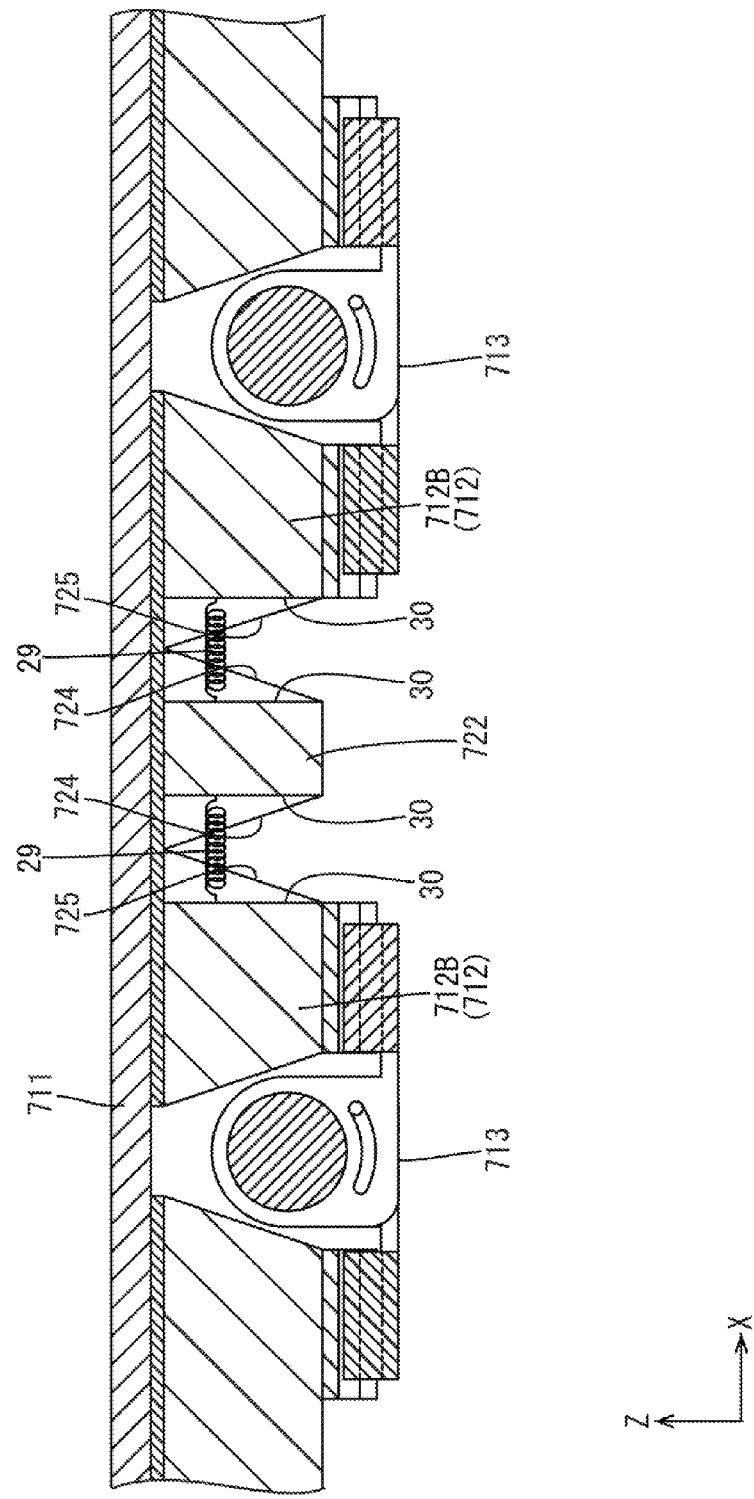
FIG. 20 is an enlarged side cross-sectional view of a flexible display panel included in a display device according to an eighth embodiment of the present technology when the flexible display panel is in a flat state.
Figure 21:
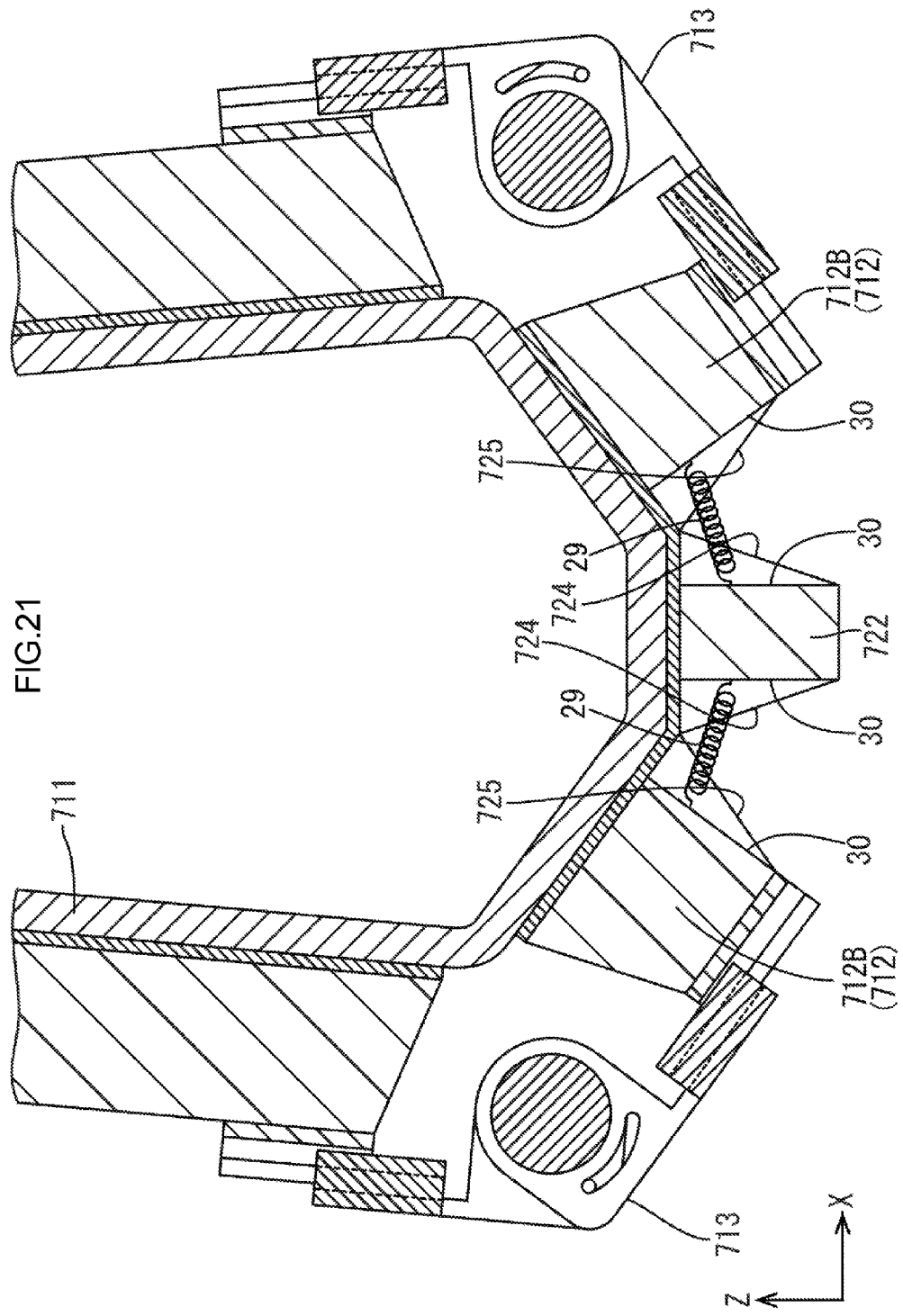
FIG. 21 is an enlarged side cross-sectional view of the flexible display panel in the folded state.

As illustrated in FIGS. 20 and 21, a pair of spring parts 29 is mounted on sub-display support portions 712B and the spacer 722 that are adjacent to each other in a flat state of a flexible display panel 711 of the present embodiment. The spring parts 29 are made of metal and elastically expand and shrink. One end of each spring part 29 is connected to the sub-display support portion 712B and another end of each spring part 29 is connected to the spacer 722. The spacer 722 has sloped surfaces 724 and the sub-display support portion 712B has sloped surface 725, and side portions (opposed side portions) of the spacer 722 and the sub-display support portion 712B having the sloped surfaces 724, 725 are partially cut away to form a spring arrangement recessed portion 30. The spring part 29 is arranged in the spring arrangement recessed portion 30. A part of each of the side portions of the sub-display support portion 712B and the spacer 722 with respect to the long-side direction is cut away to form the spring arrangement recessed portion 30. The spring part 29 physically connects the sub-display support portion 712B and the spacer 722. Accordingly, the sub-display support portion 712B and the spacer 722 can be moved and rotated without causing stress concentration on a hinge portion 713 when the flexible display panel 711 is folded. The sub-display support portions 712B and the spacer 722 are fixed to the flexible display panel 711 via a fixing layer.

As is described before, according to the present embodiment, one end of the spring part 29 is connected to the sub-display support portion 712B and another end of the spring part 29 is connected to the spacer 722 and the spring part 29 is elastically shrinks and expands. According to such a configuration, the spring part 29 shrinks when the flexible display panel 711 is folded and the sub-display support portion 712B and the spacer 722 that are connected via the spring part 29 are arranged following a shape of the bending portion of the flexible display panel 711.

Ninth Embodiment

A ninth embodiment will be described with reference to FIGS. 22 and 23. The ninth embodiment differs from the sixth embodiment in that the flexible plate member is not included and the number of spacers 822 is altered. Similar configurations, operations, and effects to the sixth embodiment will not be described.

Figure 22:
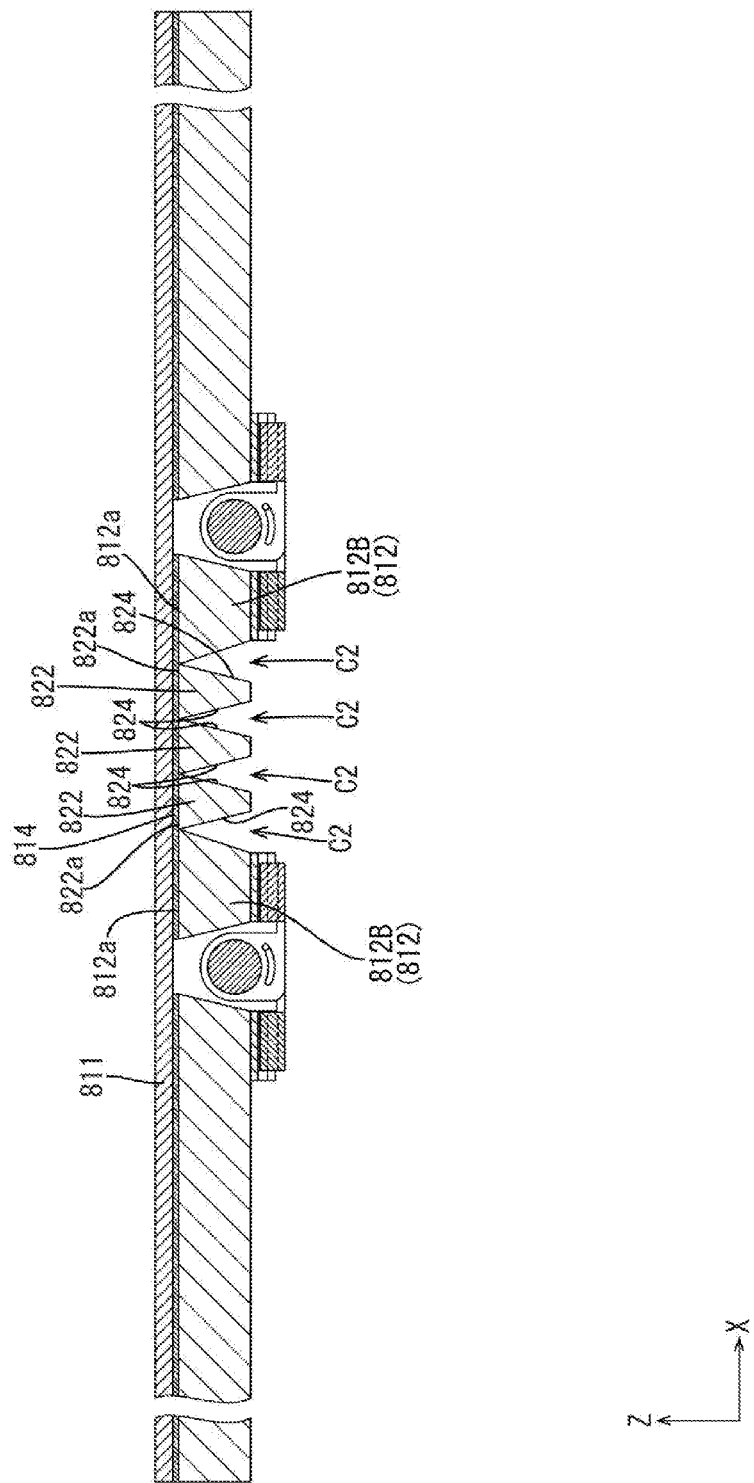
FIG. 22 is an enlarged side cross-sectional view of a flexible display panel included in a display device according to a ninth embodiment of the present technology when the flexible display panel is in a flat state.
Figure 23:
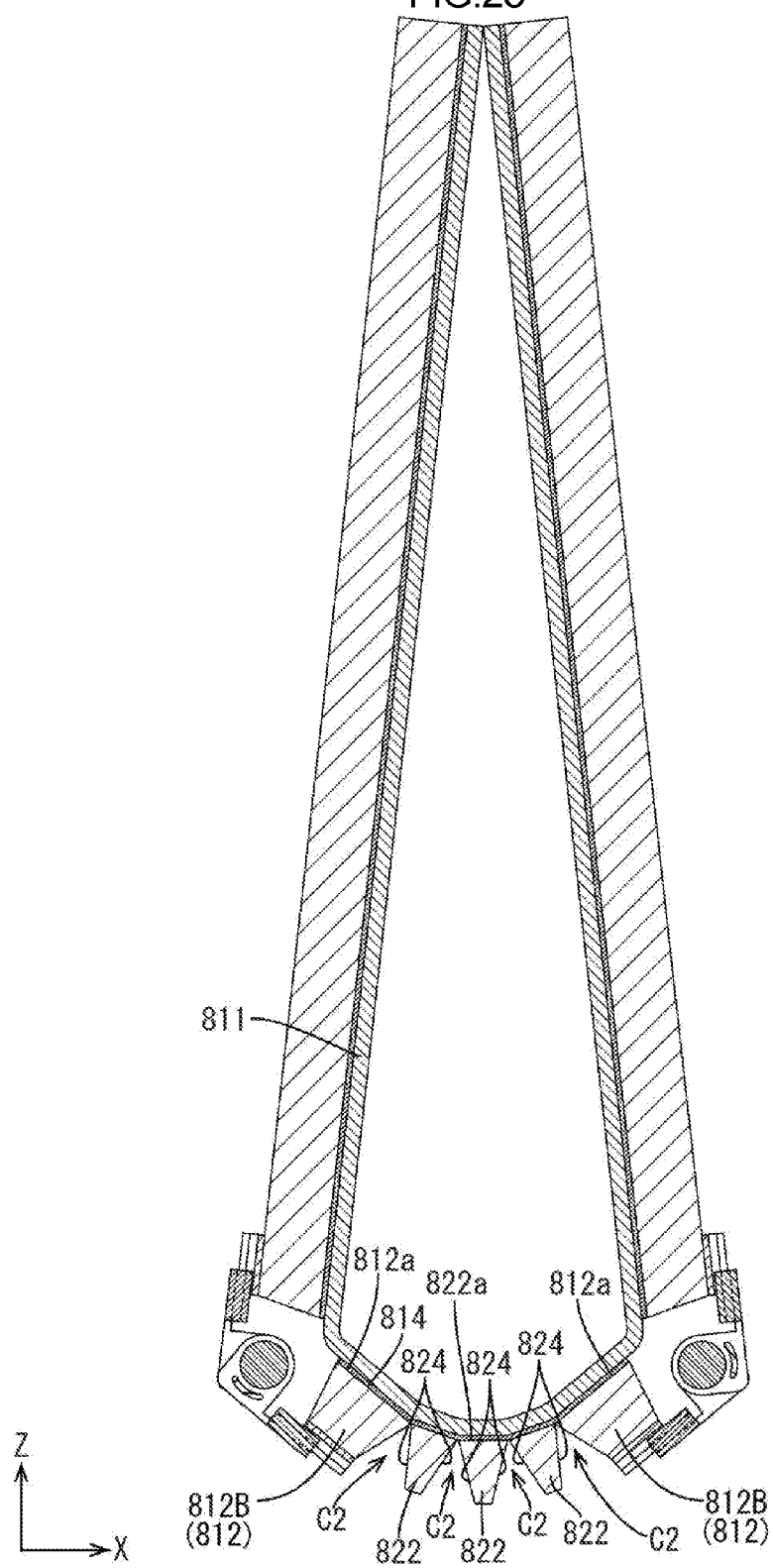
FIG. 23 is a side cross-sectional view of the flexible display panel in the folded state.

According to the present embodiment, as illustrated in FIG. 22, three spacers 822 are arranged in a line between two sub-display support portions 812B in the flat state of a flexible display panel 811. Each of the three spacers 822 has a width smaller than that of the sixth embodiment. The adjacent spacers 822 have a clearance C2 between sloped surfaces 824 of the adjacent spacers 822 similar to the clearance C2 between the sub-display support portion 812B and the spacer 822. The three spacers 822 and the two sub-display support portions 812B are fixed to the flexible display panel 811 with entire areas of support surfaces 812a, 822a via a fixing layer 814. As illustrated in FIG. 23, the clearance C2 between the sub-display support portion 812B and the spacer 822 and the clearance C2 between the adjacent spacers 822 are enlarged when the flexible display panel 811 is folded from the flat state. Accordingly, great curvature of the bending portions of the flexible display panel 811 is maintained.

Tenth Embodiment

A tenth embodiment will be described with reference to FIGS. 24 and 25. The tenth embodiment differs from the second embodiment in a shape of a main display support portion 912A. Similar configurations, operations, and effects to the second embodiment will not be described.

Figure 24:
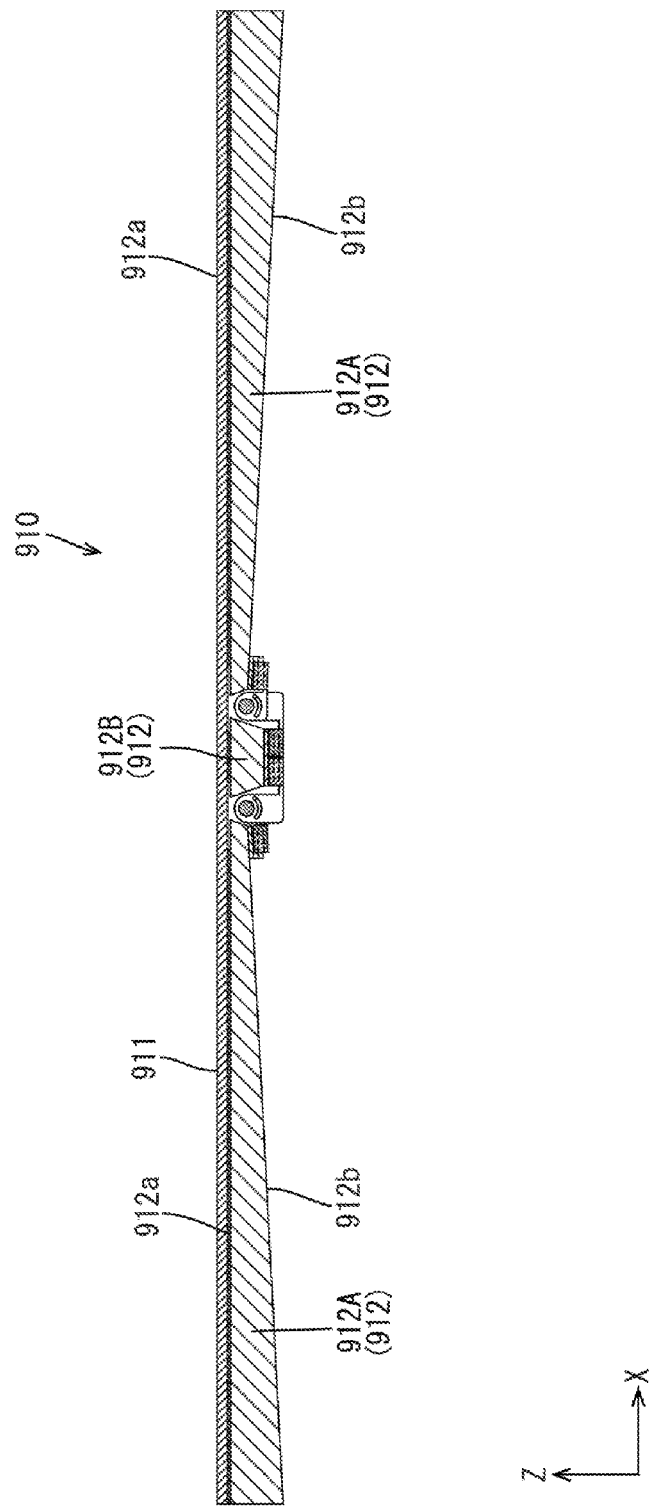
FIG. 24 is a side cross-sectional view of a flexible display panel included in a display device according to a tenth embodiment of the present technology when the flexible display panel is in a flat state.

As illustrated in FIG. 24, each of two main display support portions 912A has a dimension with respect to a direction (the Z-axis direction in FIG. 24) in which a flexible display panel 911 and a display support portion 912 are overlapped and the dimension is set as follows. When the flexible display panel 911 is in a flat state, the dimension of the main display support portion 912A gradually increases as is farther away from a sub-display support portion 912B in a middle and gradually decreases as is closer to the sub-display support portion 912B. The main display support portion 912A has a support surface 912a and an opposed surface 912b opposite to the support surface 912a. The opposed surface 912b is a sloped surface with respect to the support surface 912a in the flat state of the flexible display panel 911. In the flat state, the opposed surface 912b is sloped downward to be far away from the sub-display support portion 912B and is sloped upward to be closer to the sub-display support portion 912B.

Figure 25:
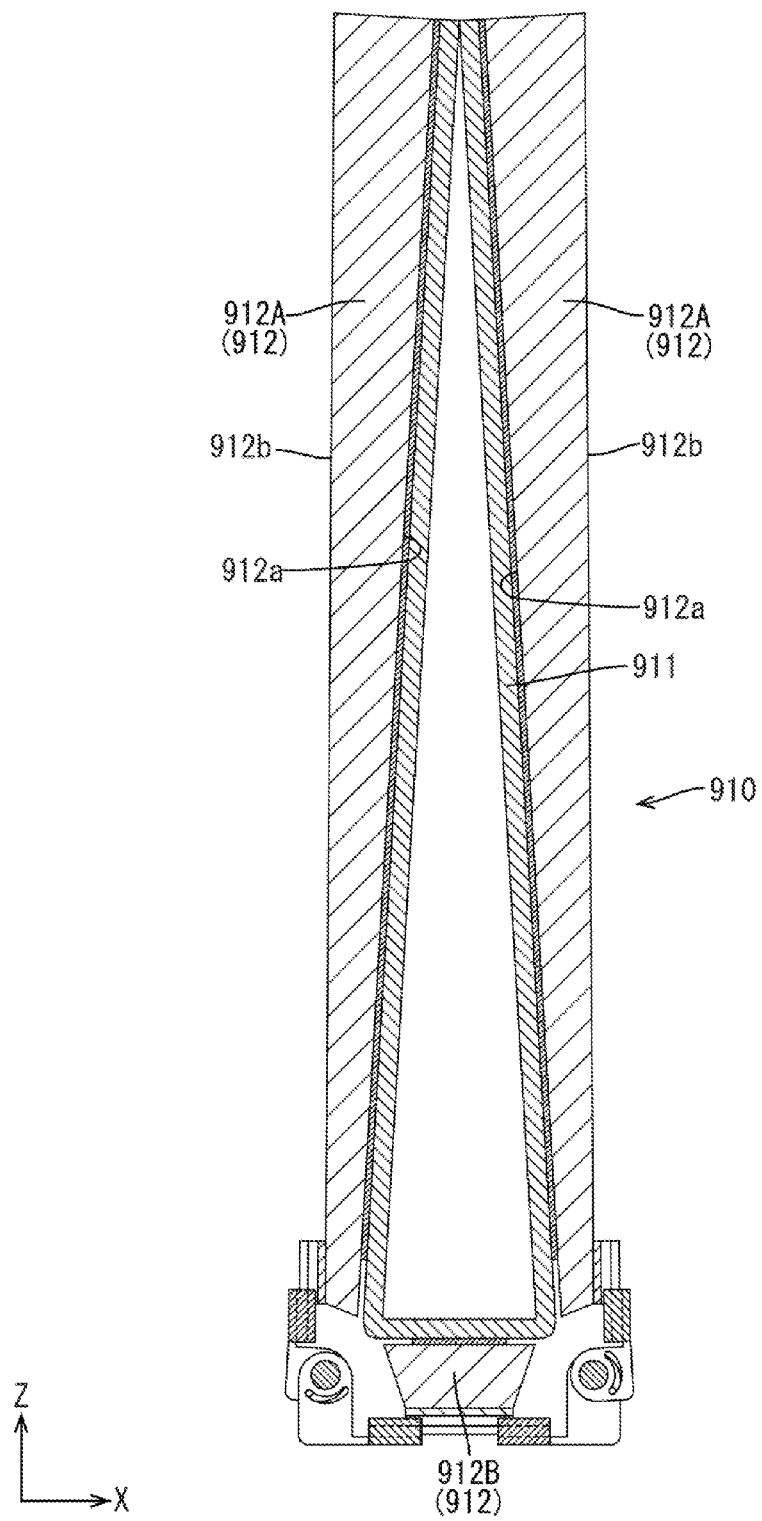
FIG. 25 is a side cross-sectional view of the flexible display panel in the folded state.

If the flexible display panel 911 is folded from the flat state, as illustrated in FIG. 25, the two main display support portions 912A are opposite each other and the opposed surfaces 912b that are opposite to the support surfaces 912a are substantially parallel to each other. Namely, a folded display device 910 has a thickness that is constant over an entire area. Accordingly, portability and design of the display device 910 is improved. In the folded state, the support surfaces 912a cross each other and are slanted with respect to the opposed surfaces 912b.

The main display support portion 912A has a short-side dimension of approximately 145 mm and a long-side dimension of approximately 210 mm and a thickness varying within a range from 5 mm to 8.5 mm. The sub-display support portion 912B has a short-side dimension of approximately 7 mm and a long-side dimension of approximately 210 mm and a thickness of approximately 8.5 mm that is a greatest value of the main display support portion 912A. The shaft diameter of the shaft portion of a hinge portion 913 is approximately 4 mm, for example.

As described before, according to the present embodiment, the display device includes the sub-display support portions 912B between the main display supporting portions 912A in the flat state of the flexible display panel 911. The main display supporting portions 912A increase a dimension thereof in a direction that the flexible display panel 911 and the main display support portion 912A are overlapped as is farther away from the sub-display support portion 912B. Accordingly, when the flexible display panel 911 is folded such that the main display supporting portions 912A are opposite each other, the opposed surfaces 912b of the main display supporting portions 912A are parallel to each other. The opposed surfaces 912b are opposite to the flexible display panel 911. Accordingly, portability and design of the display device 910 in the folded state of the flexible display panel 911 is improved.

Other Embodiments

The present invention is not limited to the embodiments described above with reference to the drawings and the following embodiments may be included in the technical filed of the present invention.

(1) In each of the above embodiments, the rotation center of the hinge portion is substantially same as a middle portion of the display supporting portion with respect to the thickness direction. However, positional relation may be altered if necessary. For example, the rotation center of the hinge portion may be closer to the flexible display panel than the middle portion of the display support portion thereof. The rotation center of the hinge portion may be away from the flexible display panel and from the middle portion of the display support portion.

(2) In each of the above embodiments, the angle restricting portion includes the stopper projection and the stopper hole. The angle restricting portion may include two stopper projections that are stopped by each other. The angle restricting portion may be configured such that one of the hinge parts included a stopper portion and the stopper portion is stopped by a known structure of another one of the hinge parts. Thus, an angle may be restricted.

(3) Other than the specific values illustrated in the drawings according to each of the embodiments, the specific values of the angle restricted by the angle restricting portion may be altered if necessary.

(4) In each of the above embodiments, the display support portion is solid. However, the display support portion may be hollow and have a space inside. In such a configuration, a circuit board, trace members, and butteries may be arranged in the space of the display support portion.

(5) Other than each of the above embodiments, the number of the main display support portions, the number of the sub-display supporting portions, and the number of the spacers may be altered if necessary.

(6) In each of the above embodiments, all of the hinge portions in the display device have the angle restricting portions. However, some of the hinge portions may have the angle restricting portions and some hinge portions may not have the angle restricting portions.

(7) Other than each of the above embodiments, an area where the fixing layer is applied, that is, a fixing area of each display supporting portion that is fixed to the flexible display panel (non-fixing area) may be altered if necessary.

(8) Other than each of the above embodiments, the specific configuration of the hinge portion may be altered if necessary. The hinge portion may include additional configuration than the hinge parts and the rotation shaft. Similarly, the specific configuration of the slide may be altered if necessary.

(9) In each of the above embodiments, the clearance is between the display supporting portions that are adjacent to each other in the flat state of the flexible display panel. However, the opposed surfaces of the display supporting portions that are adjacent to each other in the flat state of the flexible display panel may be in contact with each other without providing such a space.

(10) Other than each of the above embodiments, the hinge portion may be mounted on a different portion of the display supporting portion if necessary. Similarly, the slide may be mounted on a different portion of the display supporting portion if necessary. However, in the seventh embodiment, the connecting hinge part is preferably mounted on an end portion of the display supporting portion near the flexible display panel.

(11) According to modified examples of the third to fifth embodiments, the sub-display supporting portions may have different width dimensions.

(12) Other than the sixth to eight embodiments, the specific member connecting the sub-display supporting portion and the spacer may be altered if necessary.

(13) In the sixth to ninth embodiments, the opposed surface of the sub-display supporting portion has the sloped surface. However, the opposed surface of the sub-display supporting portion may not have the sloped surface.

(14) In the sixth to ninth embodiments, the opposed surface of the spacer has the sloped surface. However, the opposed surface of the spacer may not have the sloped surface.

(15) As modified examples of the sixth to eighth embodiments, according to a modified example of the sixth embodiment, the sub-display supporting portions and the spacer may be fixed to the flexible display panel via a fixing layer. According to modified examples of the seventh and eighth embodiments, the sub-display supporting portions and the spacer may not be fixed to the flexible display panel via the fixing layer.

(16) According to a modified example of the ninth embodiment, a part of each spacer may be fixed to the flexible display panel and rest of each spacer may not be fixed to the flexible display panel.

(17) The configuration of the third to fifth embodiments may be combined with the configuration of the sixth to ninth embodiments. In such a combination, when the flexible display panel is in the flat state, the sub-display supporting portions are arranged side-by-side and the spacer is arranged between the adjacent sub-display supporting portions.

(18) In each of the above embodiments, the organic LEDs included in the pixels of the flexible display panel emit light of three colors. For example, the organic LEDs included in the pixels may emit white light and the flexible film may include a color filter that selectively transmits the white light.

(19) In each of the above embodiments, each TFT included in the pixel of the liquid crystal panel includes oxide semiconductor. The semiconductor used in the TFT may include amorphous silicon, polycrystalline silicon, and organic semiconductor.

(20) In each of the above embodiments, a flexible organic EL display is used in the flexible display panel. A flexible liquid crystal display panel or a flexible electronic paper may be used as the flexible display panel.

(21) In each of the above embodiments, the flexible display panel includes one flexible film. However, the present technology may be applied to a configuration including two flexible films. Specifically, one of the flexible films may include an object relating the pixels and the other one of the flexible films may be put on a surface of the one flexible film where the object is formed. One of the flexible films may include an object relating the pixels and the other one of the flexible films may be put on a surface (an outer surface) opposite to the surface of the one flexible film where the object is formed.

EXPLANATION OF SYMBOLS

10, 210, 310, 410, 510, 910: display device, 11, 111, 211, 311, 411, 511, 611, 711, 811, 911: flexible display panel, 11a: display surface, 12, 112, 212, 312, 412, 512, 612, 712, 812, 912: display support portion, 12A, 112A, 212A, 312A, 412A, 512A, 912A: main display support portion, 12B, 112B, 212B, 312B, 412B, 512B, 612B, 712B, 812B, 912B: sub-display support portion, 12a 112a, 212a, 512a, 812a, 912a: support surface, 12b, 512b, 912b: surface, 12c, 512c: opposed surface, 13, 213, 413, 513, 613, 713: hinge portion, 15, 215: first hinge part, 16, 216: second hinge part, 18, 218: angle restricting portion, 19, 219: stopper projection (stopper portion), 20, 220: stopper hole (stopper portion), 22, 622, 722, 822: spacer, 22a, 822a: support surface, 22b: opposed surface, 23, 223, 423: slide portion, 24, 624, 724: sloped surface, 25, 625, 725: sloped surface, 27: connecting hinge part, 29: spring part, C1: clearance, C2: clearance

The invention claimed is:
1. A display device comprising:
a flexible display panel having a display surface displaying images and having flexibility;
display support portions that are arranged along the display surface of the flexible display panel that is in a flat state and support the flexible display panel from a side opposite to the display surface;

a hinge portion including at least two hinge parts that are mounted on two of the display support portions, respectively, the two display support portions being adjacent to each other when the flexible display panel is in the flat state, and the hinge portion supporting the two adjacent display support portions to be rotatable;

an angle restricting portion mounted on each of the two hinge parts, the angle restricting portion including at least two stopper portions that are stopped by each other when an angle formed by the two adjacent display supporting portions reaches a predetermined value, the two adjacent display supporting portions being rotated according to bending of the flexible display panel from the flat state and the angle being formed by the two adjacent display supporting portions that are rotated, and the angle restricting portion restricting the angle; and a slide portion mounted on the two adjacent display support portions and the hinge portion, the slide portion with which the two adjacent display support portions slide with respect to the hinge portion according to rotation of the two adjacent display support portions.

2. The display device according to claim 1, wherein the two adjacent display support portions have opposed surfaces, respectively, and the opposed surfaces are opposite each other with a clearance therebetween when the flexible display panel is in the flat state.

3. The display device according to claim 1, wherein
the two adjacent display support portions have support surfaces supporting the flexible display panel, and
the support surfaces are fixed to the flexible display panel except for an end portion of each of the support surfaces near a bending portion of the flexible display panel that is folded.

4. The display device according to claim 1, wherein
the display support portions include at least three display support portions that are arranged in a row when the flexible display panel is in the flat state,
the display support portions include main display support portions and a sub-display support portion,
the main display support portions have a relatively large support area supporting the flexible display panel, and
the sub-display support portion is arranged between the main display support portions when the flexible display panel is in the flat state, and the sub-display support portion has a relatively small support area supporting the flexible display panel.

5. The display device according to claim 4, wherein the sub-display support portion includes sub-display portions and the sub-display portions are arranged adjacent to each other when the flexible display panel is in the flat state.

6. The display device according to claim 4, wherein
the sub-display support portion includes sub-display support portions, and the display device further comprising:
a spacer arranged between the sub-display support portions when the flexible display panel is in the flat state.

7. The display device according to claim 6, wherein
the spacer has an opposed surface and each of the sub-display support portions has an opposed surface, and the opposed surfaces are opposite each other, and
at least one of the opposed surface is a sloped surface inclined such that a distance between the opposed surfaces gradually increases as is farther away from the flexible display panel in a direction that the flexible display panel and the display support portions are overlapped.

8. The display device according to claim 6, further comprising:
connecting hinge parts in pair mounted on the sub-display support portions and the spacer and supporting the sub-display support portions and the spacer rotatably.

9. The display device according to claim 6, further comprising:
a spring part that is elastically shrunk and expanded and one end of which is connected to the sub-display support portion and another end of which is connected to the spacer.

10. The display device according to claim 4, wherein
the main display support portion includes main display support portions in pair having the sub-display support portion therebetween when the flexible display panel is in the flat state, and
each of the main display support portions has a dimension in a direction that the flexible display panel and the main display support portions are overlapped, and the dimension increases as is farther away from the sub-display support portion.

11. The display device according to claim 1, wherein
the hinge parts of the hinge portion are mounted on the two adjacent display support portions, respectively, on a surface of each of the two adjacent display support portions, the surface is opposite to a support surface supporting the flexible display panel.

* * * * *